US012588360B2

(12) United States Patent
Zhang et al.

(10) Patent No.: US 12,588,360 B2
(45) Date of Patent: Mar. 24, 2026

(54) DISPLAY SUBSTRATE AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Yang Zhang, Beijing (CN); Qinghe Wang, Beijing (CN); Haitao Wang, Beijing (CN); Duoduo Wang, Beijing (CN); Shan Liu, Beijing (CN); Xiaodong Zhang, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 493 days.

(21) Appl. No.: 18/040,983

(22) PCT Filed: Apr. 28, 2022

(86) PCT No.: PCT/CN2022/089806
§ 371 (c)(1),
(2) Date: Feb. 8, 2023

(87) PCT Pub. No.: WO2023/206212
PCT Pub. Date: Nov. 2, 2023

(65) Prior Publication Data
US 2024/0188328 A1 Jun. 6, 2024

(51) Int. Cl.
*H01L 29/08* (2006.01)
*H10K 59/121* (2023.01)
(Continued)

(52) U.S. Cl.
CPC ..... *H10K 59/1213* (2023.02); *H10K 59/1216* (2023.02); *H10K 59/122* (2023.02); *H10K 59/124* (2023.02); *H10K 59/1315* (2023.02)

(58) Field of Classification Search
CPC ............. H10K 59/1213; H10K 59/122; H10K 59/124; H10K 59/1315
(Continued)

(56) References Cited

U.S. PATENT DOCUMENTS

| | | | |
|---|---|---|---|
| 10,249,698 B2 | 4/2019 | Han | |
| 10,886,308 B2 | 1/2021 | Ma et al. | |

(Continued)

FOREIGN PATENT DOCUMENTS

| | | |
|---|---|---|
| CN | 106653817 A | 5/2017 |
| CN | 209182622 U | 7/2019 |

(Continued)

*Primary Examiner* — Phuc T Dang
(74) *Attorney, Agent, or Firm* — Westman, Champlin & Koehler, P.A.

(57) ABSTRACT

A display substrate and a display device are provided. The display substrate includes: a plurality of pixel units arranged on a base substrate; a first conductive layer, a semiconductor layer, a second conductive layer and a pixel definition layer sequentially arranged on the base substrate. A pixel driving circuit includes a sensing transistor, a storage capacitance and a capacitance wire. A source electrode and a drain electrode of the sensing transistor are located in the second conductive layer, a second capacitance electrode of the storage capacitance and the capacitance wire are located in the first conductive layer. The capacitance wire includes a capacitance wire body portion extending in a second direction. For one same sub-pixel, an orthographic projection of the capacitance wire body portion of the pixel driving circuit thereof on the base substrate is spaced apart from that of the light emitting region thereof on the base substrate.

19 Claims, 14 Drawing Sheets

(51) Int. Cl.
  *H10K 59/122* (2023.01)
  *H10K 59/124* (2023.01)
  *H10K 59/131* (2023.01)

(58) Field of Classification Search
  USPC .......................................................... 257/40
  See application file for complete search history.

(56) References Cited

U.S. PATENT DOCUMENTS

| | | |
|---|---|---|
| 11,581,372 B2 | 2/2023 | Wu et al. |
| 11,709,562 B2 | 7/2023 | Ma et al. |
| 2005/0073620 A1 | 4/2005 | Gotoh et al. |
| 2018/0233550 A1 | 8/2018 | Han |
| 2019/0051675 A1 | 2/2019 | Ma et al. |
| 2020/0020747 A1 | 1/2020 | Bok et al. |
| 2021/0089186 A1 | 3/2021 | Ma et al. |
| 2021/0167161 A1 | 6/2021 | Yang et al. |
| 2021/0202604 A1 | 7/2021 | Wu et al. |
| 2021/0408143 A1 | 12/2021 | Zhou |
| 2022/0013612 A1 | 1/2022 | Xu et al. |

FOREIGN PATENT DOCUMENTS

| | | | | |
|---|---|---|---|---|
| CN | 110459568 A | | 11/2019 | |
| CN | 111755489 A | | 10/2020 | |
| CN | 112596306 A | | 4/2021 | |
| CN | 112750861 A | * | 5/2021 | ............. H10D 84/01 |
| CN | 113725233 A | | 11/2021 | |
| CN | 215578574 U | | 1/2022 | |
| JP | 2005045017 A | | 2/2005 | |
| JP | 2019032456 A | | 2/2019 | |
| JP | 2021068774 A | * | 4/2021 | |
| TW | 201301364 A | * | 1/2013 | ......... H10K 59/1213 |
| WO | 2021102996 A1 | | 6/2021 | |
| WO | 2021103010 A1 | | 6/2021 | |

* cited by examiner

<u>10</u>

ACT

10&40&ACT

10&40&ACT&30

10&40&ACT&30&IDL1

10&40&ACT&30&IDL1
&IDL2

<u>10&40&ACT&30&IDL1</u>
<u>&IDL2&20</u>

10&40&ACT&30&IDL1
&IDL2&20&PDL

DISPLAY SUBSTRATE AND DISPLAY DEVICE

CROSS REFERENCE TO RELATED APPLICATION(S)

This application is a Section 371 National Stage Application of International Application No. PCT/CN2022/089806, filed on Apr. 28, 2022, entitled "DISPLAY PANEL AND DISPLAY DEVICE", the entire content of which is incorporated herein by reference in its entirety.

TECHNICAL FIELD

The present disclosure relates to a field of display technology, and in particular to a display panel and a display device.

BACKGROUND

The organic light emitting diode (OLED) display panel has advantages of active light emitting, good temperature characteristics, low power consumption, fast response and flexibility. It has gradually become one of mainstream display technologies, and is increasingly widely used in mobile phones, computers, televisions and other display devices. In the back panel design of the OLED display panel, it is one of important tasks for researchers to ensure a transmittance of a light emitting region.

It should be noted that the information disclosed in the Background section is merely for enhancement of understanding of the background of the present disclosure, and therefore may contain information that does not form the related art that is already known to those skilled in the art.

SUMMARY

In an aspect, a display substrate is provided, including: a base substrate: a plurality of pixel units arranged on the base substrate, wherein the plurality of pixel units are arranged in an array in a first direction and a second direction, at least one pixel unit includes a plurality of sub-pixels, and at least one sub-pixel includes a light emitting element and a pixel driving circuit for driving the light emitting element: a semiconductor layer arranged on the base substrate; a first conductive layer arranged on a side of the semiconductor layer close to the base substrate; a second conductive layer arranged on a side of the semiconductor layer away from the base substrate; and a pixel definition layer arranged on a side of the second conductive layer away from the base substrate, wherein the pixel definition layer includes a plurality of openings for defining light emitting regions of the plurality of sub-pixels, wherein the pixel driving circuit includes a sensing transistor, a storage capacitance and a capacitance wire, the sensing transistor includes a source electrode and a drain electrode, the storage capacitance includes a first capacitance electrode and a second capacitance electrode arranged opposite to each other, and the capacitance wire is configured to electrically connect one of the source electrode and the drain electrode of the sensing transistor with the second capacitance electrode: wherein the source electrode and the drain electrode of the sensing transistor are located in the second conductive layer, the second capacitance electrode and the capacitance wire are located in the first conductive layer, and the capacitance wire includes a capacitance wire body portion extending in the second direction: and wherein for one and the same sub-pixel, an orthographic projection of the capacitance wire body portion of the pixel driving circuit of the sub-pixel on the base substrate is spaced apart from an orthographic projection of the light emitting region of the sub-pixel on the base substrate.

According to some exemplary embodiments of the present disclosure, the display substrate further includes a data line for supplying a data signal, the data line is located in the second conductive layer, and the data line includes a data line body portion extending in the second direction: and wherein for one and the same sub-pixel, the data line body portion of the data line configured to supply the data signal to the pixel driving circuit of the sub-pixel has an orthographic projection on the base substrate that at least partially overlaps with an orthographic projection of the capacitance wire body portion of the pixel driving circuit of the sub-pixel on the base substrate.

According to some exemplary embodiments of the present disclosure, for one and the same sub-pixel, the data line body portion of the data line configured to supply the data signal to the pixel driving circuit of the sub-pixel has an orthographic projection on the base substrate that completely covers the orthographic projection of the capacitance wire body portion of the pixel driving circuit of the sub-pixel on the base substrate.

According to some exemplary embodiments of the present disclosure, for one and the same sub-pixel, an orthographic projection of the second capacitance electrode of the pixel driving circuit of the sub-pixel on the base substrate at least partially overlaps with the orthographic projection of the light emitting region of the sub-pixel on the base substrate: and wherein the capacitance wire includes a first connecting portion and a second connecting portion, the capacitance wire body portion is located between the first connecting portion and the second connecting portion, the first connecting portion is connected to the second capacitance electrode, and the second connecting portion is electrically connected to one of the source electrode and the drain electrode of the sensing transistor.

According to some exemplary embodiments of the present disclosure, the display substrate further includes a third conductive layer located between the semiconductor layer and the second conductive layer: wherein the display substrate further includes a first auxiliary wire located in the third conductive layer, the first auxiliary wire extends in the second direction, and the first auxiliary wire is electrically connected to the data line: and wherein for one and the same sub-pixel, the first auxiliary wire electrically connected to the data line configured to supply a data signal to the pixel driving circuit of the sub-pixel has an orthographic projection on the base substrate that at least partially overlaps with the orthographic projection of the capacitance wire body portion of the pixel driving circuit of the sub-pixel on the base substrate.

According to some exemplary embodiments of the present disclosure, the first capacitance electrode is located in the semiconductor layer: and wherein for one and the same sub-pixel, an orthographic projection of the first capacitance electrode of the pixel driving circuit of the sub-pixel on the base substrate at least partially overlaps with the orthographic projection of the light emitting region of the sub-pixel on the base substrate.

According to some exemplary embodiments of the present disclosure, the display substrate further includes a first scanning signal line and a second scanning signal line for supplying gate scanning signals, and the first scanning signal line and the second scanning signal line are located in the third conductive layer: wherein the pixel driving circuit further includes a switching transistor, a part of the first scanning signal line overlapping with the semiconductor layer is a gate electrode of the switching transistor, and a part of the second scanning signal line overlapping with the semiconductor layer is a gate electrode of the sensing transistor: and wherein the first scanning signal line and the second scanning signal line configured to supply gate scanning signals to the pixel driving circuits of a same row of sub-pixels are respectively located on two sides of the light emitting regions of the same row of sub-pixels in the second direction.

According to some exemplary embodiments of the present disclosure, the display substrate further includes a fourth conductive layer between the first conductive layer and the semiconductor layer: wherein the display substrate further includes a third conductive connecting portion located in the fourth conductive layer and a third semiconductor portion located in the semiconductor layer, the third semiconductor portion includes a third source region, a third drain region and a channel region of the sensing transistor, and the third source region and the third drain region are respectively located on two sides of the channel region of the sensing transistor: and wherein the third conductive connecting portion includes a first part and a second part, an orthographic projection of the first part of the third conductive connecting portion on the base substrate overlaps with an orthographic projection of the second connecting portion of the capacitance wire on the base substrate, and an orthographic projection of one of the third source region and the third drain region on the base substrate overlaps with an orthographic projection of the second part of the third conductive connecting portion on the base substrate.

According to some exemplary embodiments of the present disclosure, the display substrate further includes a first insulation layer and a second insulation layer, and the first insulation layer and the second insulation layer are located between the third conductive layer and the second conductive layer: wherein the display substrate includes a first via hole penetrating the first insulation layer and a second via hole penetrating the second insulation layer: wherein the first via hole exposes the first part of the third conductive connecting portion, and the second via hole exposes the first part and the second part of the third conductive connecting portion: and wherein an orthographic projection of one of the source electrode and the drain electrode of the sensing transistor on the base substrate covers each of an orthographic projection of the first via hole on the base substrate and an orthographic projection of the second via hole on the base substrate.

According to some exemplary embodiments of the present disclosure, the display substrate further includes a first conductive connecting portion located in the fourth conductive layer, and an orthographic projection of the first conductive connecting portion on the base substrate at least partially overlaps with the orthographic projection of the first capacitance electrode on the base substrate.

According to some exemplary embodiments of the present disclosure, the pixel driving circuit further includes a driving transistor, and the driving transistor includes a channel region, a gate electrode, a source electrode and a drain electrode: wherein the display substrate further includes a first semiconductor portion located in the semiconductor layer, the first semiconductor portion includes a first source region, a first drain region and a channel region of the driving transistor, and the first source region and the first drain region are respectively located on two sides of the channel region of the driving transistor: wherein the display substrate includes a third via hole penetrating the first insulation layer and a fourth via hole penetrating the second insulation layer: wherein the third via hole exposes a part of the first conductive connecting portion, and the fourth via hole exposes the third via hole and a part of one of the first source region and the first drain region: and wherein an orthographic projection of one of the source electrode and the drain electrode of the driving transistor on the base substrate covers each of an orthographic projection of the third via hole on the base substrate and an orthographic projection of the fourth via hole on the base substrate.

According to some exemplary embodiments of the present disclosure, the switching transistor includes a channel region, the display substrate further includes a second semiconductor portion located in the semiconductor layer, the second semiconductor portion includes a second source region, a second drain region and a channel region of the switching transistor, and the second source region and the second drain region are respectively located on two sides of the channel region of the switching transistor: and wherein the second capacitance electrode and the second semiconductor portion are formed as a continuously extending integral structure.

According to some exemplary embodiments of the present disclosure, the display substrate includes a fifth via hole penetrating the second insulation layer: and wherein the fifth via hole exposes a part of the gate electrode of the driving transistor and a part of the first capacitance electrode, and the gate electrode of the driving transistor, the first capacitance electrode and one of the source electrode and the drain electrode of the switching transistor are electrically connected through the fifth via hole.

According to some exemplary embodiments of the present disclosure, two data lines are arranged between two adjacent sub-pixels located in a same row, the two adjacent sub-pixels located in the same row include a first sub-pixel and a second sub-pixel, and the two data lines include a first data line and a second data line: wherein the first data line is configured to supply a data signal to the first sub-pixel, and the data line body portion of the data line configured to supply the data signal to the pixel driving circuit of the first sub-pixel has an orthographic projection on the base substrate that completely covers an orthographic projection of the capacitance wire body portion of the pixel driving circuit of the first sub-pixel on the base substrate; and wherein the second data line is configured to supply a data signal to the second sub-pixel, and the data line body portion of the data line configured to supply the data signal to the pixel driving circuit of the second sub-pixel has an orthographic projection on the base substrate that completely covers an orthographic projection of the capacitance wire body portion of the pixel driving circuit of the second sub-pixel on the base substrate.

According to some exemplary embodiments of the present disclosure, the first connecting portion of the capacitance wire of the pixel driving circuit of the first sub-pixel extends toward the first data line in the first direction, and the first connecting portion of the capacitance wire of the pixel driving circuit of the second sub-pixel extends toward the second data line in the first direction.

According to some exemplary embodiments of the present disclosure, the display substrate further includes a sensing signal line located in the second conductive layer, and the sensing signal line includes a first part extending in the second direction and a second part extending in the first direction: and wherein the second sub-pixel is adjacent to the sensing signal line in the first direction, and the first sub-pixel is located on a side of the second sub-pixel away from the sensing signal line.

According to some exemplary embodiments of the present disclosure, the display substrate further includes a second conductive connecting portion located in the fourth conductive layer; and wherein one end of the second conductive connecting portion is electrically connected to the other of the source electrode and the drain electrode of the sensing transistor of the pixel driving circuit of the first sub-pixel through a sixth via hole, and the other end of the second conductive connecting portion is electrically connected to the other of the source electrode and the drain electrode of the sensing transistor of the pixel driving circuit of the second sub-pixel through a seventh via hole.

According to some exemplary embodiments of the present disclosure, the second part of the sensing signal line is electrically connected to the other end of the second conductive connecting portion and the other of the source electrode and the drain electrode of the sensing transistor of the pixel driving circuit of the second sub-pixel through an eighth via hole.

According to some exemplary embodiments of the present disclosure, the display substrate further includes a second auxiliary wire located in the third conductive layer, the second auxiliary wire extends in the second direction, the second auxiliary wire is electrically connected to the sensing signal line, and an orthographic projection of the second auxiliary wire on the base substrate at least partially overlaps with an orthographic projection of the sensing signal line on the base substrate.

According to some exemplary embodiments of the present disclosure, the first conductive layer includes a transparent conductive material: and/or wherein the fourth conductive layer includes a light shielding material.

In another aspect, a display device is provided, including the display substrate described above.

BRIEF DESCRIPTION OF THE DRAWINGS

Other objectives and advantages of the present disclosure would be obvious through the following descriptions of the present disclosure with reference to the accompanying drawings, which may facilitate a comprehensive understanding of the present disclosure.

FIGS. 3 to 12 are partial plan views of at least one film layer of a display substrate according to some exemplary embodiments of the present disclosure, respectively, in which: FIG. 3 schematically shows a partial plan view of a first conductive layer of the display substrate, FIG. 4 schematically shows a partial plan view of a combination of the first conductive layer and a fourth conductive layer of the display substrate, FIG. 5 schematically shows a partial plan view of a semiconductor layer of the display substrate, FIG. 6 schematically shows a partial plan view of a combination of the first conductive layer, the fourth conductive layer and the semiconductor layer of the display substrate, FIG. 7 schematically shows a partial plan view of a third conductive layer of the display substrate, FIG. 8 schematically shows a partial plan view of a combination of the first conductive layer, the fourth conductive layer, the semiconductor layer and the third conductive layer of the display substrate, FIG. 9 schematically shows a partial plan view of a combination of the first conductive layer, the fourth conductive layer, the semiconductor layer, the third conductive layer and a first insulation layer of the display substrate, FIG. 10 schematically shows a partial plan view of a combination of the first conductive layer, the fourth conductive layer, the semiconductor layer, the third conductive layer, the first insulation layer and a second insulation layer of the display substrate, FIG. 11 schematically shows a partial plan view of a second conductive layer of the display substrate, and FIG. 12 schematically shows a partial plan view of a combination of the first conductive layer, the fourth conductive layer, the semiconductor layer, the third conductive layer, the first insulation layer, the second insulation layer and the second conductive layer of the display substrate.

Figure 1:
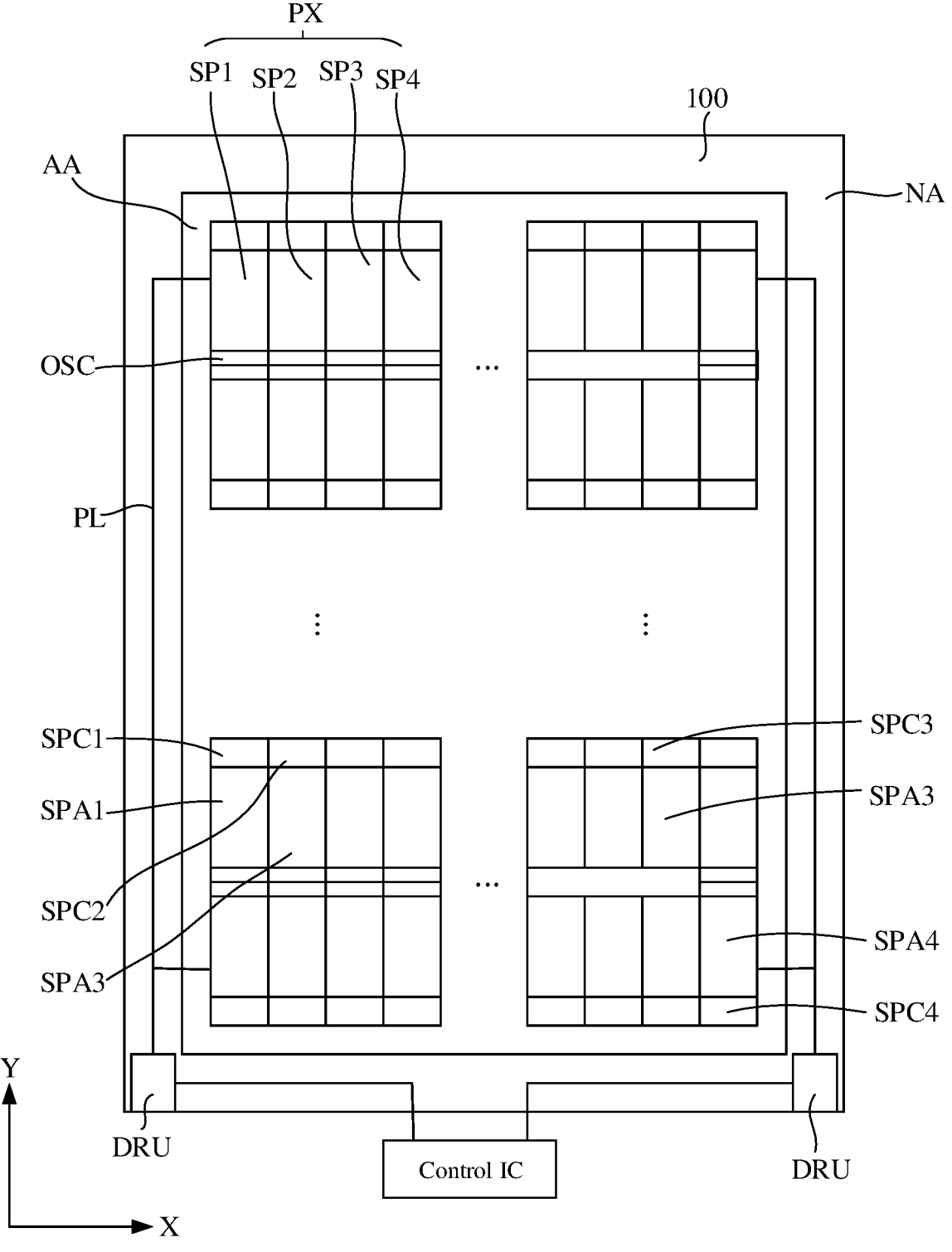
FIG. 1 is a schematic plan view of a display substrate according to the embodiments of the present disclosure.

It should be noted that for the sake of clarity, in the accompanying drawings used to describe the embodiments of the present disclosure, sizes of layers, structures or regions may be enlarged or reduced, that is, these drawings are not drawn according to actual scale.

DETAILED DESCRIPTION OF EMBODIMENTS

Technical solutions of the present disclosure will be further described in detail below through the embodiments with reference to the accompanying drawings. In the specification, the same or similar reference numerals indicate the same or similar components. The following descriptions of the embodiments of the present disclosure with reference to the accompanying drawings are intended to explain a general inventive concept of the present disclosure, and should not be understood as a limitation on the present disclosure.

In addition, in the following detailed descriptions, for ease of explanation, many specific details are set forth to provide a comprehensive understanding of the embodiments of the present disclosure. However, it is obvious that one or more embodiments may also be implemented without these specific details.

It should be understood that, although the terms "first," "second" and so on may be used here to describe different elements, these elements should not be limited by these terms. These terms are merely used to distinguish one element from another element. For example, without departing from the scope of the exemplary embodiments, a first element may be named as a second element, and similarly, a second element may be named as a first element. The term "and/or" as used here includes any and all combinations of one or more related listed items.

It should be understood that when an element or layer is referred to as being "formed on" another element or layer, the element or layer may be directly or indirectly formed on the another element or layer. That is, for example, there may be an intermediate element or an intermediate layer. In contrast, when an element or layer is referred to as being "directly formed on" another element or layer, there is no intermediate element or intermediate layer. Other terms used to describe a relationship between elements or layers (for example, "between" and "directly between", "adjacent to" and "directly adjacent to", etc.) should be interpreted in a similar manner.

Herein, the directional expressions "first direction" and "second direction" are used to describe different directions of pixel layout, e.g., a lateral direction and a longitudinal direction of the pixel layout. It should be understood that, such expressions are merely exemplary descriptions, rather than limiting the present disclosure.

Herein, unless otherwise specified, the expression "located in the same layer" generally means that a first component and a second component may be made of the same material and may be formed by the same patterning process. The expression "A and B are connected as a whole" means that component A and component B are integrally formed, that is, they generally contain the same material and are formed as a structurally continuous complete component.

Transistors used in the embodiments of the present disclosure may be thin film transistors, or field effect transistors, or other devices with same characteristics. Since a source electrode and a drain electrode of the thin film transistor used here are symmetrical with respect to each other, the source electrode and the drain electrode thereof may be interchanged. In the following examples, a P-type thin film transistor used as a driving transistor is mainly described, and the types of other transistors may be the same or different from the driving transistor according to a circuit design. Similarly, in other embodiments, the driving transistor may also be shown as an N-type thin film transistor.

Some exemplary embodiments of the present disclosure provide a display substrate, including: a base substrate: a plurality of pixel units arranged on the base substrate, wherein the plurality of pixel units are arranged in an array in a first direction and a second direction, at least one pixel unit includes a plurality of sub-pixels, and at least one sub-pixel includes a light emitting element and a pixel driving circuit for driving the light emitting element: a semiconductor layer arranged on the base substrate: a first conductive layer arranged on a side of the semiconductor layer close to the base substrate: a second conductive layer arranged on a side of the semiconductor layer away from the base substrate: and a pixel definition layer arranged on a side of the second conductive layer away from the base substrate. The pixel definition layer includes a plurality of openings for defining light emitting regions of the plurality of sub-pixels. The pixel driving circuit includes a sensing transistor, a storage capacitance and a capacitance wire. The sensing transistor includes a source electrode and a drain electrode, the storage capacitance includes a first capacitance electrode and a second capacitance electrode arranged opposite to each other, and the capacitance wire is used to electrically connect one of the source electrode and the drain electrode of the sensing transistor with the second capacitance electrode. The source electrode and the drain electrode of the sensing transistor are located in the second conductive layer, the second capacitance electrode and the capacitance wire are located in the first conductive layer, and the capacitance wire includes a capacitance wire body portion extending in the second direction. For one and the same sub-pixel, an orthographic projection of the capacitance wire body portion of the pixel driving circuit of the sub-pixel on the base substrate is spaced apart from an orthographic projection of the light emitting region of the sub-pixel on the base substrate. In the embodiments of the present disclosure, by arranging most of the capacitance wire (e.g., the capacitance wire body portion) outside the light emitting region of the sub-pixel, a shielding effect of the capacitance wire on the light emitted from the light emitting region may be reduced, thereby a light transmittance of the light emitting region may be improved. In this way, a display quality of the display substrate may be improved without affecting the driving of the sensing transistor.

Figure 13:
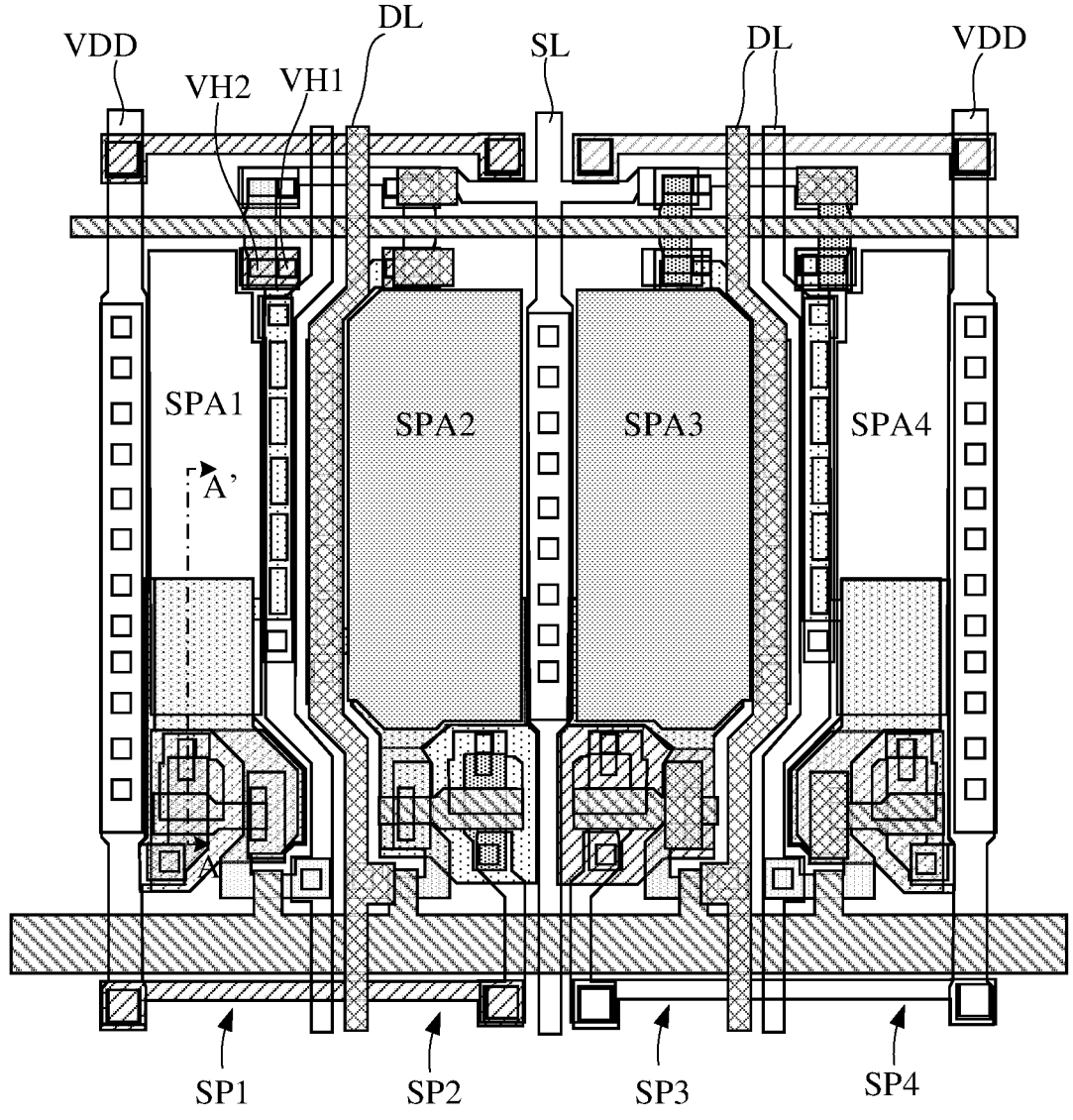
FIG. 13 is a partial plan view of a display substrate according to some exemplary embodiments of the present disclosure.

FIG. 1 is a schematic plan view of a display substrate according to the embodiments of the present disclosure. FIG. 13 is a partial plan view of the display substrate according to some exemplary embodiments of the present disclosure, in which more specific structures of the display substrate are schematically shown. With reference to FIG. 1 and FIG. 13 in combination, the display substrate according to the embodiments of the present disclosure may include a base substrate 100, a pixel unit PX arranged on the base substrate 100, a driving unit DRU arranged on the base substrate 100, and a wire PL electrically connecting the pixel unit PX with the driving unit DRU. The driving unit DRU is used to drive the pixel unit PX.

The display substrate may include a display region AA and a non-display region NA. The display region AA may be a region in which the pixel unit PX for displaying image is arranged. Each pixel unit PX will be described later. The non-display region NA is a region in which no pixel unit PX is arranged, that is, a region that does not display image. The driving unit DRU for driving the pixel unit PX and some wires PL for connecting the pixel unit PX with the driving unit DRU may be arranged in the non-display region NA. The non-display region NA corresponds to a bezel in a final display device, and a width of the bezel may be determined according to a width of the non-display region NA.

The display region AA may have various shapes. For example, the display region AA may be provided in various shapes such as a closed polygon (e.g., rectangle) including straight sides, a circle or an ellipse, etc., including a curved side, and a semicircle or a semi-ellipse, etc., including a straight side and a curved side. In the embodiments of the present disclosure, the display region AA is provided as a region having a quadrangular shape including straight sides. It should be understood that this is merely an exemplary embodiment of the present disclosure, rather than a limitation on the present disclosure.

The non-display region NA may be arranged on at least one side of the display region AA. In the embodiments of the present disclosure, the non-display region NA may surround a periphery of the display region AA. In the embodiments of the present disclosure, the non-display region NA may include a lateral portion extending in a first direction X and a longitudinal portion extending in a second direction Y.

The pixel unit PX is arranged in the display region AA. The pixel unit PX is a smallest unit for displaying image, and a plurality of pixel units may be provided. For example, the pixel unit PX may include a light emitting device that emits white light and/or color light.

A plurality of pixel units PX may be provided to be arranged in a matrix form along rows extending in the first direction X and columns extending in the second direction Y. However, the embodiments of the present disclosure do not specifically limit an arrangement form of the pixel units PX, and the pixel units PX may be arranged in various forms. For example, the pixel units PX may be arranged such that a direction inclined with respect to the first direction X and the second direction Y is a column direction, and a direction intersecting the column direction is a row direction.

A pixel unit PX may include a plurality of sub-pixels. For example, a pixel unit PX may include three sub-pixels, including a first sub-pixel SP1, a second sub-pixel SP2 and a third sub-pixel SP3. For another example, a pixel unit PX may include four sub-pixels, including a first sub-pixel SP1, a second sub-pixel SP2, a third sub-pixel SP3 and a fourth sub-pixel SP4. For example, the first sub-pixel SP1 may be a red sub-pixel, the second sub-pixel SP2 may be a green sub-pixel, the third sub-pixel SP3 may be a blue sub-pixel, and the fourth sub-pixel SP4 may be a white sub-pixel.

Each sub-pixel may include a light emitting element and a pixel driving circuit for driving the light emitting element. For example, the first sub-pixel SP1 may include a first light emitting element located in a first light emitting region SPA1 and a first pixel driving circuit SPC1 for driving the first light emitting element, and the first light emitting element may emit red light; the second sub-pixel SP2 may include a second light emitting element located in a second light emitting region SPA2 and a second pixel driving circuit SPC2 for driving the second light emitting element, and the second light emitting element may emit green light: the third sub-pixel SP3 may include a third light emitting element located in a third light emitting region SPA3 and a third pixel driving circuit SPC3 for driving the third light emitting element, and the third light emitting element may emit blue light: and the fourth sub-pixel SP4 may include a fourth light emitting element located in a fourth light emitting region SPA4 and a fourth pixel driving circuit SPC4 for driving the fourth light emitting element.

The light emitting region of the sub-pixel may be a region where the light emitting element of the sub-pixel is located. For example, in the OLED display substrate, the light emitting element of the sub-pixel may include a first electrode (e.g., anode), a luminescent material layer and a second electrode (e.g., cathode) that are stacked. In this way, the light emitting region of the sub-pixel may be a region corresponding to a part of the luminescent material layer sandwiched between the anode and the cathode. For another example, in the OLED display substrate, the display substrate may include a pixel definition layer arranged on the base substrate 100, the pixel definition layer may include a plurality of openings corresponding to a plurality of sub-pixels, and the plurality of openings respectively define light emitting regions of the plurality of sub-pixels.

The sub-pixel further includes a non-light emitting region. For example, a part of the pixel driving circuit of the sub-pixel is located in the non-light emitting region of the sub-pixel. A ratio of an area of the light emitting region of each sub-pixel to an overall area of the sub-pixel (a sum of the area of the light emitting region and an area of the non-light emitting region) determines an opening rate of the sub-pixel.

A light emitting device (e.g., a light emitting layer, referred to as EL layer for short) of the OLED may not have enough consistency during fabrication. For example, when fabricating the EL layer by an evaporation process, fabricated EL layers of each sub-pixels may be inconsistent due to a limitation of the evaporation process, resulting in non-uniform luminance or chromaticity of different sub-pixels. Moreover, with an increase of time of use, the EL layer may age to different degrees, which may also cause inconsistency of the EL layers of each sub-pixel, thereby resulting in non-uniform luminance or chromaticity of different sub-pixels. In the embodiments of the present disclosure, the display substrate may further include a photosensitive circuit OSC that may sense light actually emitted by the pixel unit. In this way, in the embodiments of the present disclosure, the display substrate may perform an optical compensation on the sub-pixels in each pixel units based on the light actually emitted by the pixel unit which is sensed by the photosensitive circuit OSC, so as to improve a light emission uniformity of the display substrate.

For example, in some exemplary embodiments of the present disclosure, each pixel unit PX is provided with a photosensitive circuit OSC. Each photosensitive circuit OSC senses the light actually emitted by the pixel unit PX in which the photosensitive circuit OSC is located.

For example, in the embodiments of the present disclosure, at least two pixel units PX may share a photosensitive circuit OSC. For the pixel units in a same column, two pixel units PX located in two adjacent rows may share a photosensitive circuit OSC. In this way, it is not necessary to provide each pixel unit PX with a photosensitive circuit, and the number of photosensitive circuits may be reduced, so that the opening rate may be improved.

When the display substrate is in a display state, the photosensitive circuit OSC may sense the light actually emitted by two pixel units adjacent to the photosensitive circuit OSC. For example, the photosensitive circuit OSC may include at least a photoelectric conversion element. In this way, the photosensitive circuit OSC may be used to: sense the light actually emitted by the two pixel units adjacent to the photosensitive circuit OSC: and transmit a sensing electrical signal according to the sensed light.

For another example, referring to FIG. 1, the photosensitive circuit OSC may transmit the sensing electrical signal to an external circuit, such as a control IC of a display device. The control IC may control a control signal transmitted to the pixel unit PX according to the sensing electrical signal. For example, the control IC may control a data signal transmitted to the pixel driving circuit of each sub-pixel. Each sub-pixel may emit light accordingly under the control of the data signal.

In the embodiment shown in FIG. 1, the sub-pixels SP1, SP2, SP3 and SP4 are arranged side by side, and each of the sub-pixels SP1, SP2, SP3 and SP4 may have a respective data line DL.

Figure 2:
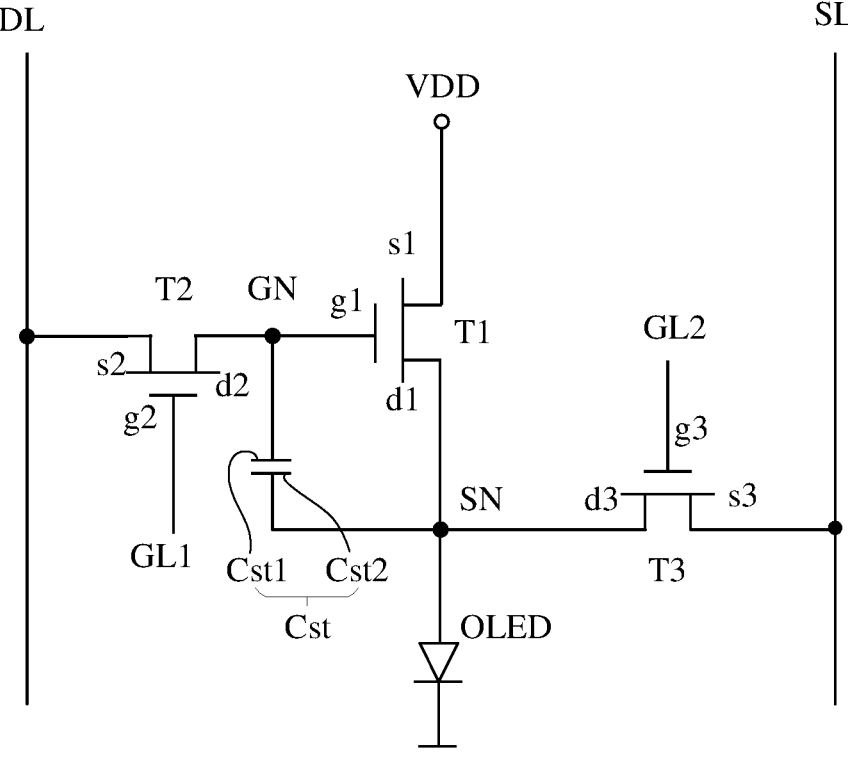
FIG. 2 is an equivalent circuit diagram of a pixel circuit of a single sub-pixel of the display substrate in FIG. 1.

FIG. 2 is an equivalent circuit diagram of a pixel circuit of a single sub-pixel of the display substrate in FIG. 1. The pixel driving circuit shown in FIG. 2 may be any one of the above-mentioned pixel driving circuits SPC1, SPC2, SPC3 and SPC4. Referring to FIG. 2, the pixel driving circuit may include a plurality of elements such as a driving transistor T1, a switching transistor T2, a sensing transistor T3 and a storage capacitance Cst, etc. The pixel driving circuit may be referred to as a 3T1C structure.

It should be noted that the 3T1C structure is illustrated here by way of example in describing the pixel driving circuit included in the display substrate according to the embodiments of the present disclosure, however, the pixel driving circuit included in the display substrate in the embodiments of the present disclosure is not limited to the 3T1C structure.

Continuing to refer to FIG. 2, a gate electrode g2 of the switching transistor T2 is connected to a first scanning signal line GL1, a first electrode of the switching transistor T2 is connected to the data line DL, and a second electrode of the switching transistor T2 is connected to a gate electrode g1 of the driving transistor T1. For example, the second electrode of the switching transistor T2 and the gate electrode g1 of the driving transistor T1 may be electrically connected to a node GN. The switching transistor T2 is used to control writing of a voltage signal from the data line DL to the pixel driving circuit.

It should be noted that each transistor may include an active layer, a gate electrode, a first electrode (e.g., a source electrode) and a second electrode (e.g., a drain electrode). For example, the switching transistor T2 includes the gate electrode g2 and an active layer ACT2; the driving transistor T1 includes the gate electrode g1 and an active layer ACT1; the sensing transistor T3 includes a gate electrode g3 and an active layer ACT3. In the embodiments of the present disclosure, the active layer of the transistor may be located in the semiconductor layer, and the gate electrode may be located in the conductive layer on a side of the semiconductor layer away from the base substrate.

It should be noted that herein, the first electrode of the transistor may refer to one of the source electrode (e.g., s1, s2, s3) and the drain electrode (e.g., d1, d2, d3) of the transistor, and the second electrode of the transistor may refer to the other of the source electrode (e.g., s1, s2, s3) and the drain electrode (e.g., d1, d2, d3) of the transistor.

The gate electrode g1 of the driving transistor T1 is electrically connected to the node GN, the first electrode of the driving transistor T1 is electrically connected to a first power supply signal (e.g., a high voltage level signal VDD), and the second electrode of the driving transistor T1 may be electrically connected to an anode of a light emitting element OLED, so that a driving current may be generated according to a voltage signal, so as to drive the light emitting element OLED to emit light. For example, the light emitting element OLED may be an organic light emitting diode (OLED).

Two ends of the storage capacitance Cst are respectively connected to the gate electrode g1 and the drain electrode d1 of the driving transistor T1, so as to store the voltage signal input from the data line DL. For example, one end of the storage capacitance Cst is electrically connected to the node GN, and the other end of the storage capacitance Cst is electrically connected to a node SN. For example, the storage capacitance Cst may include a first capacitance electrode Cst1 and a second capacitance electrode Cst2. The first capacitance electrode Cst1 of the storage capacitance Cst, the second electrode (e.g., the drain electrode d2) of the switching transistor T2 and the gate electrode g1 of the driving transistor T1 are electrically connected to the node GN. The second capacitance electrode Cst2 of the storage capacitance Cst, the second electrode (e.g., the drain electrode d1) of the driving transistor T1 and the anode of the light emitting element OLED are electrically connected to the node SN.

The gate electrode g3 of the sensing transistor T3 is electrically connected to a second scanning signal line GL2, the first electrode (e.g., the source electrode s3) of the sensing transistor T3 is electrically connected to a sensing signal line SL, and the second electrode (e.g., the drain electrode d3) of the sensing transistor T3 is electrically connected to the node SN. That is, the second capacitance electrode Cst2 of the storage capacitance Cst, the second electrode (e.g., the drain electrode d1) of the driving transistor T1, the anode of the light emitting element OLED and the second electrode (e.g., the drain electrode d3) of the sensing transistor T3 are electrically connected to the node SN.

The anode of the light emitting element OLED is electrically connected to the node SN, and a cathode of the light emitting element OLED is electrically connected to a second power signal (e.g., a low voltage level signal VSS). The level signals VDD and VSS are both DC voltage signals which are used to provide necessary voltages for driving the light emitting element OLED to emit light.

Figure 3:
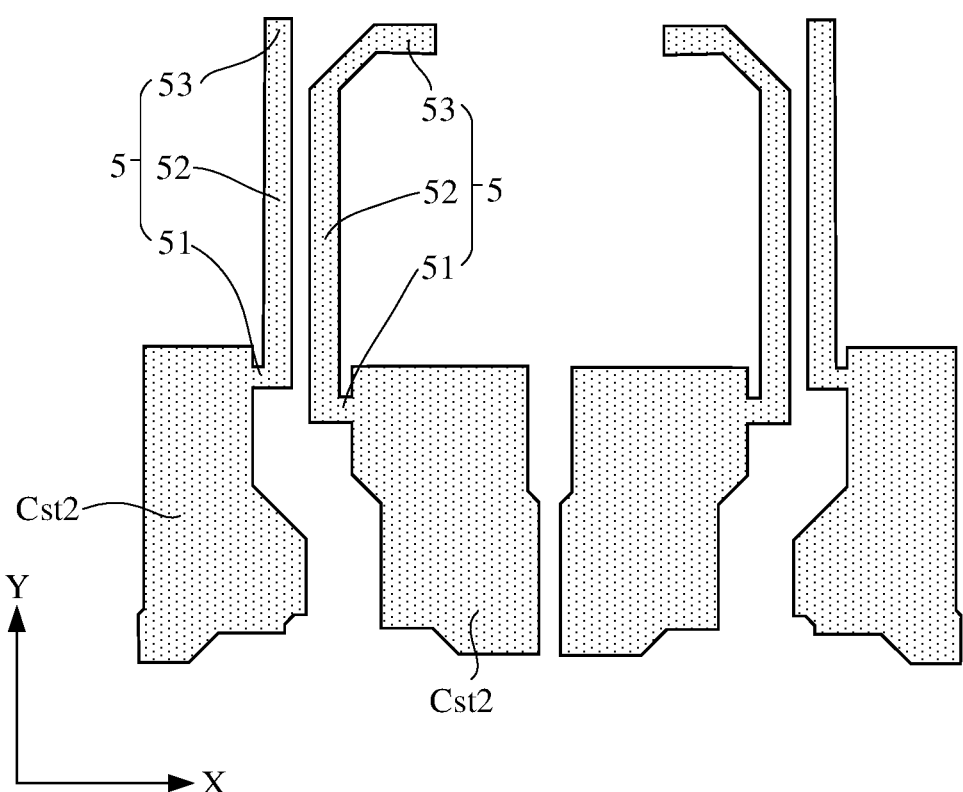
Figure 4:
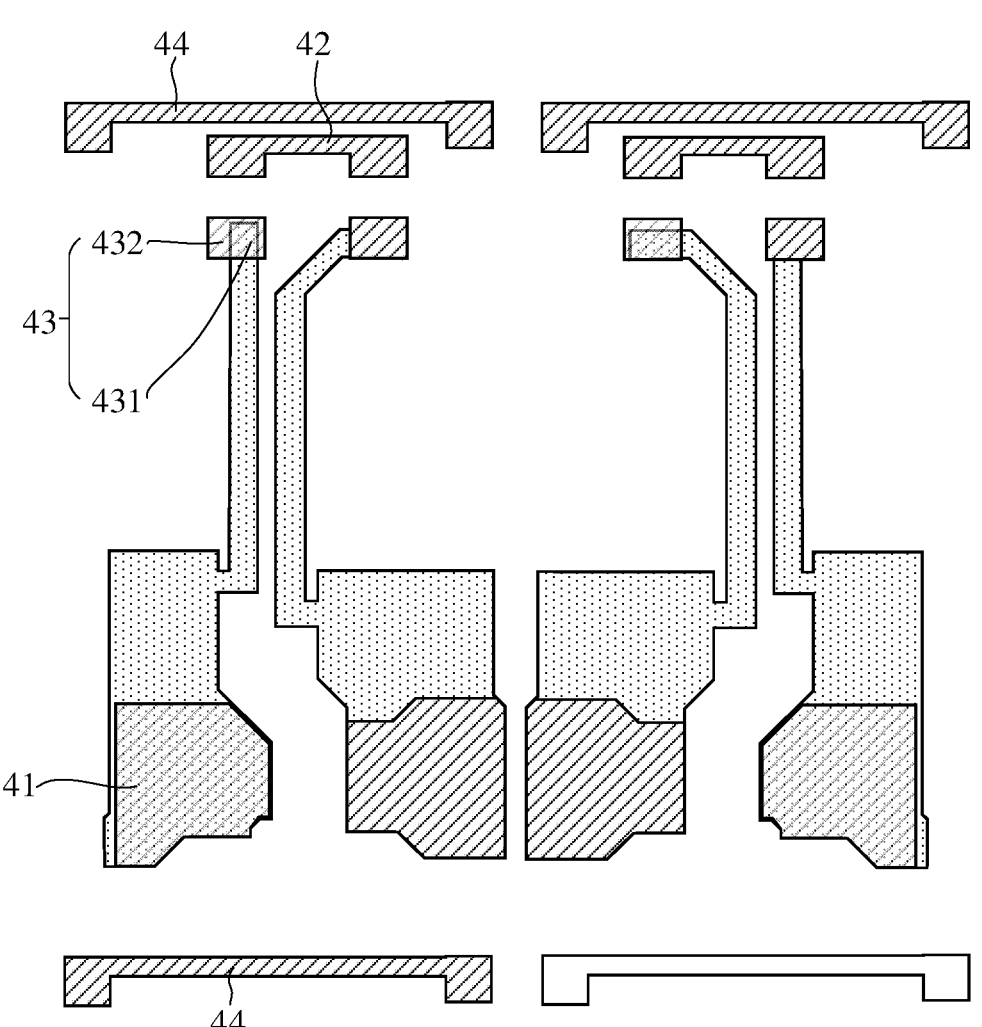
Figure 5:
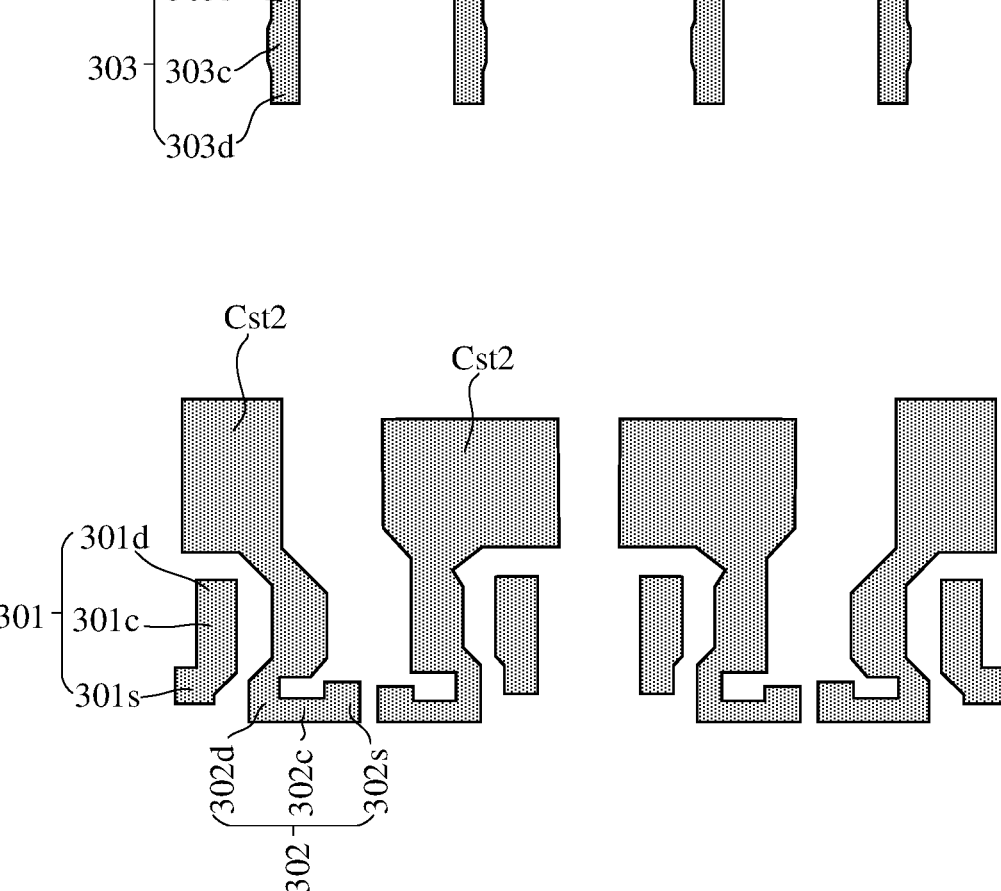
Figure 6:
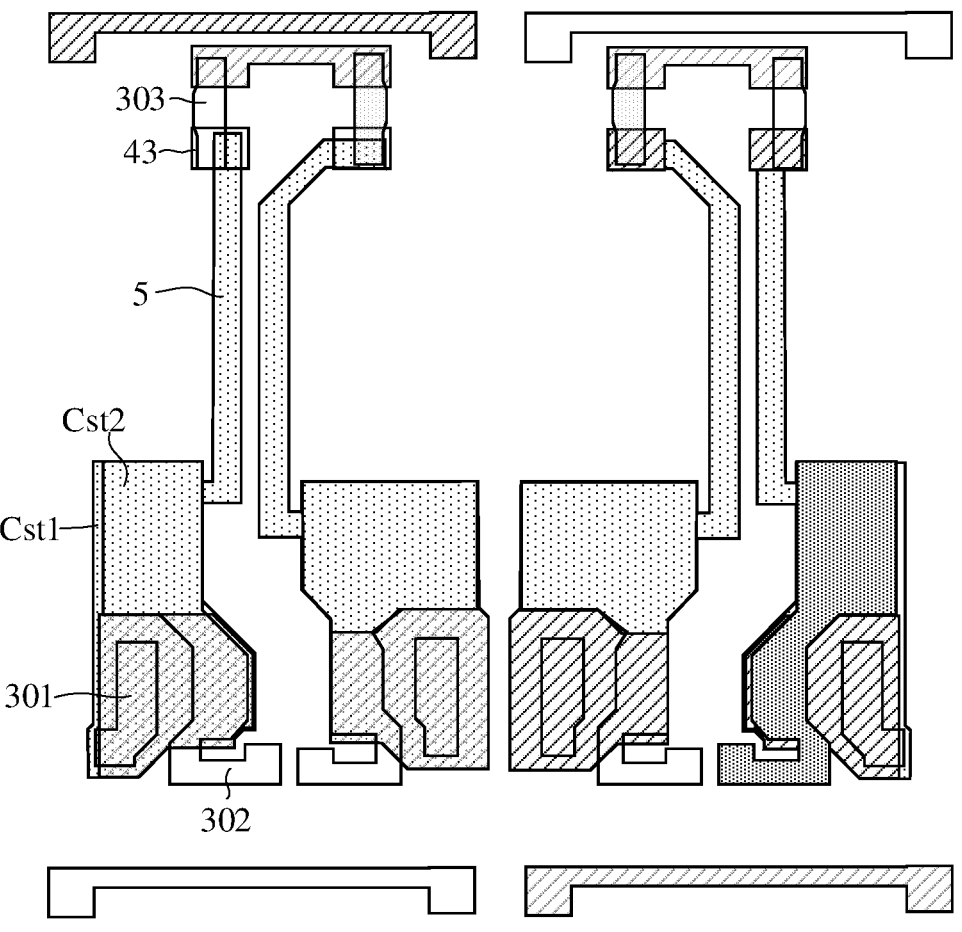
Figure 7:
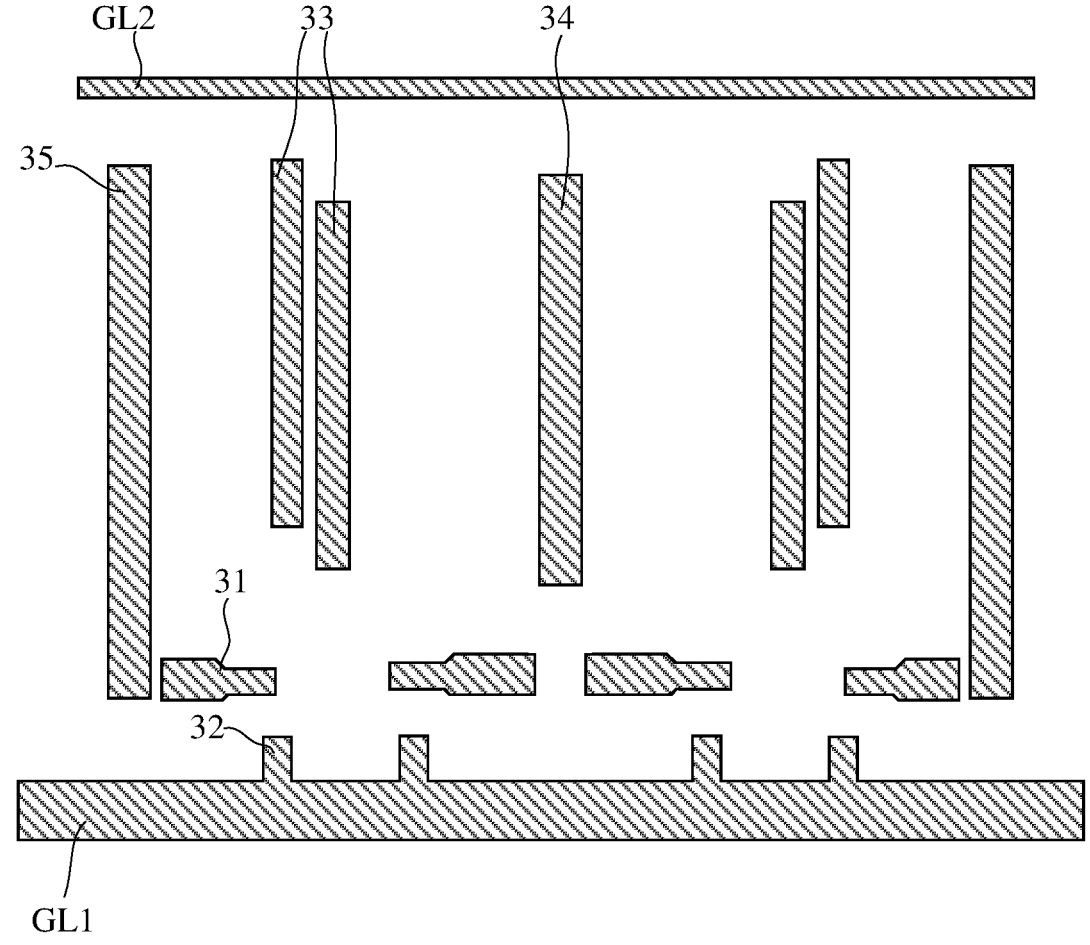
Figure 8:
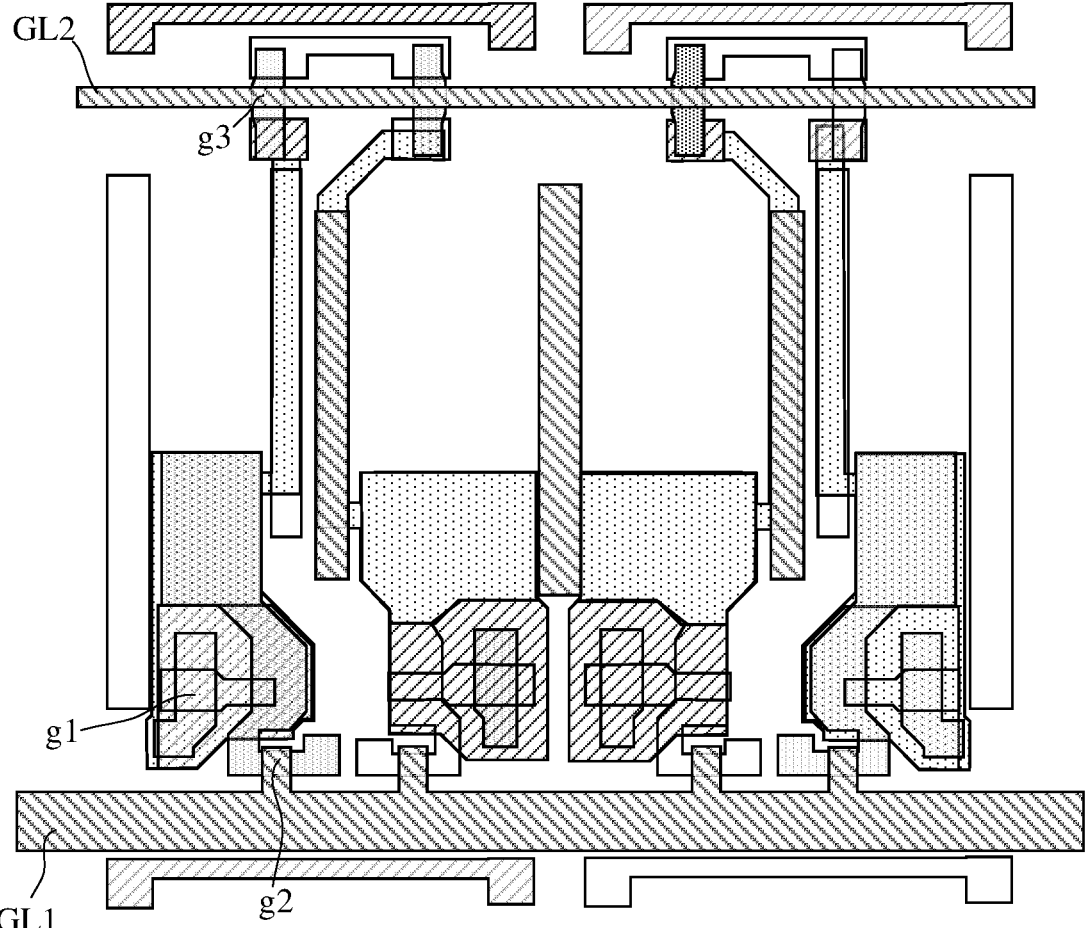
Figure 9:
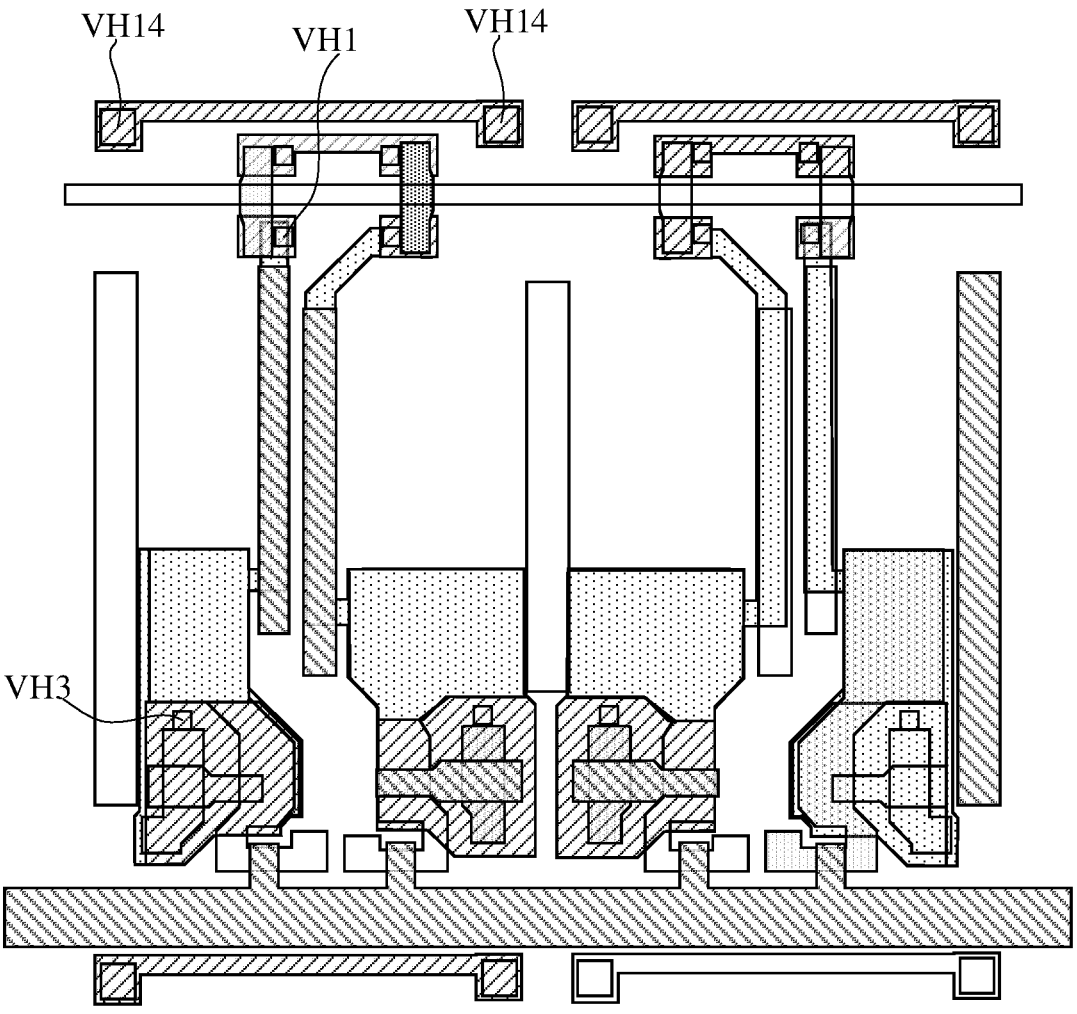
Figure 10:
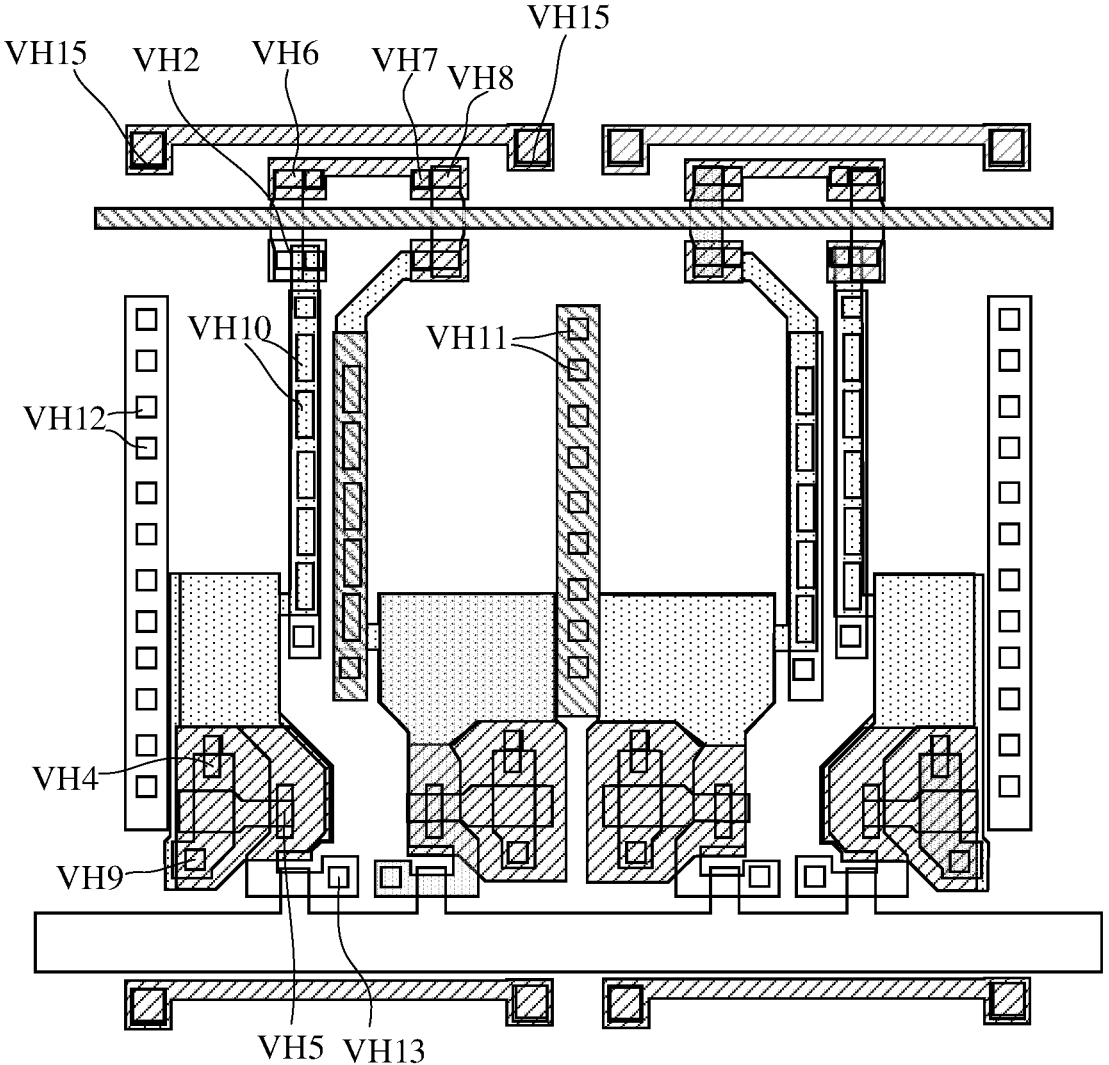
Figure 11:
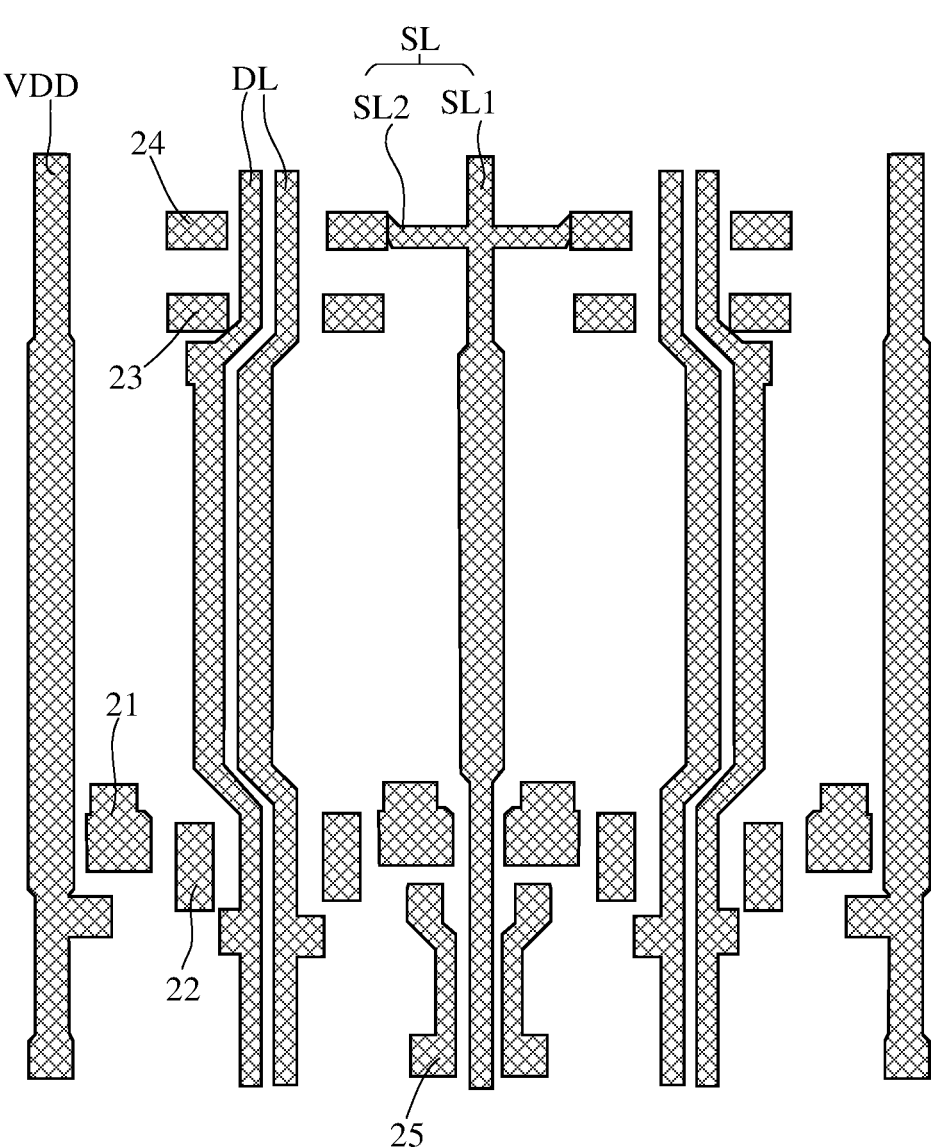
Figure 12:
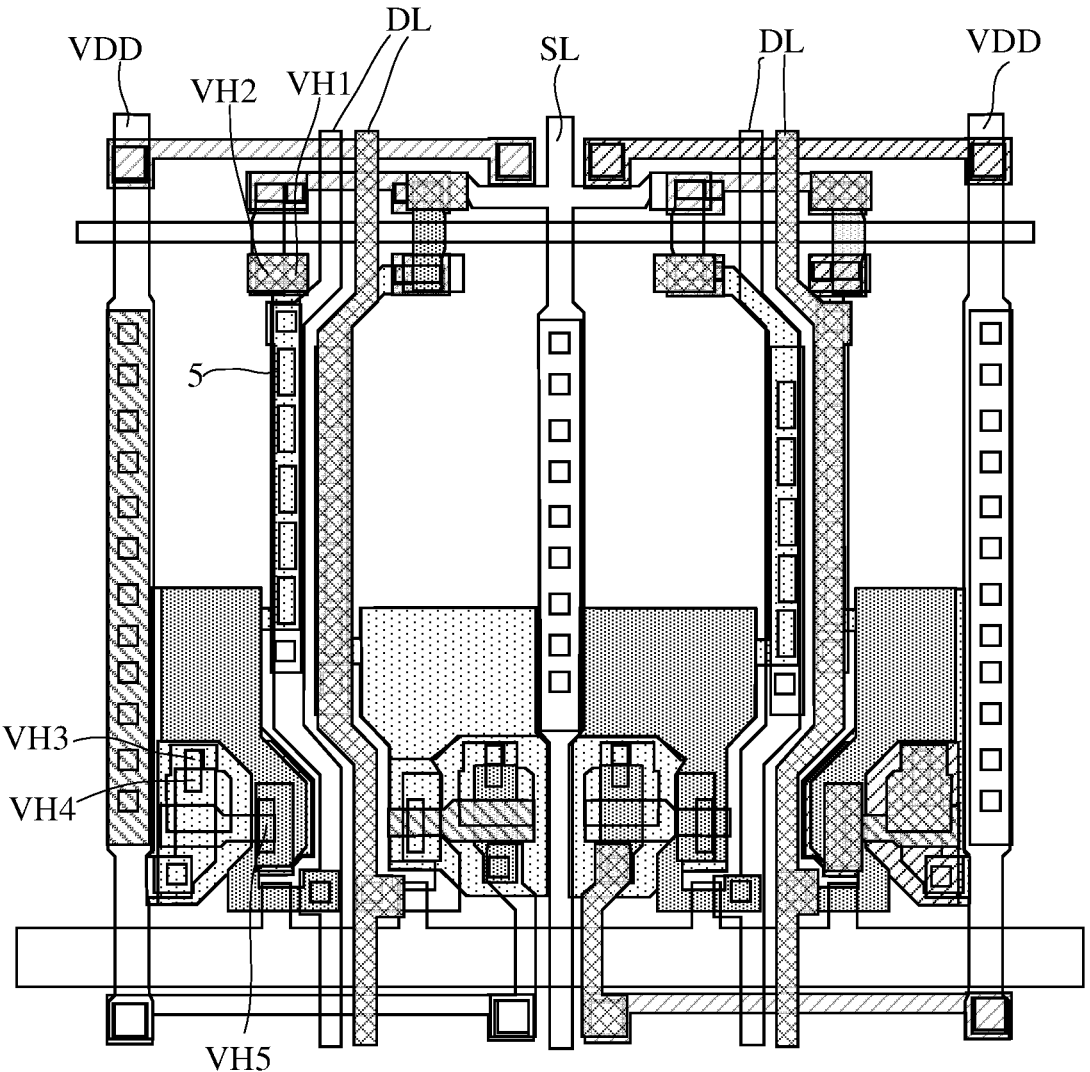
Figure 14:
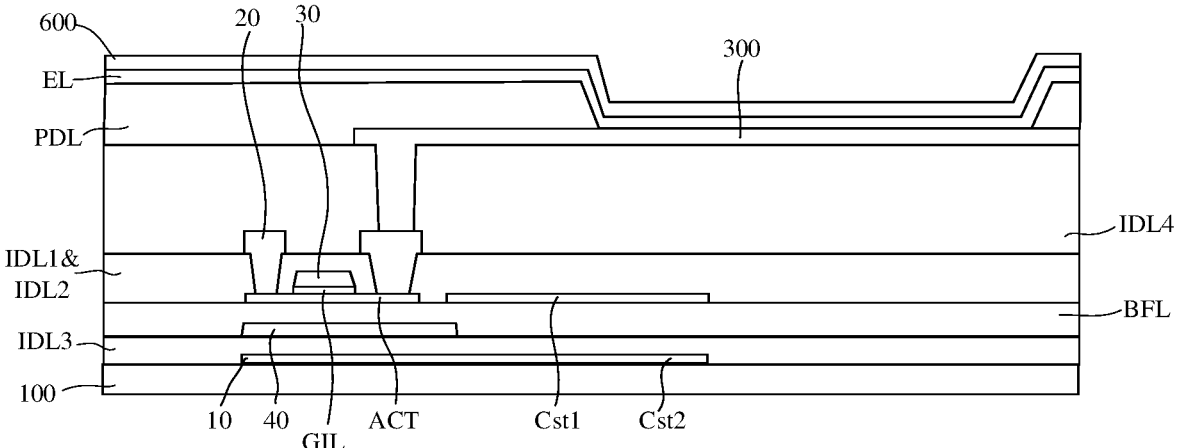
FIG. 14 is a cross-sectional view of the display substrate according to some exemplary embodiments of the present disclosure taken along line AA' in FIG. 13.

FIG. 13 is a partial plan view of a display substrate according to some exemplary embodiments of the present disclosure. FIGS. 3 to 12 are partial plan views of at least one film layer of a display substrate according to some exemplary embodiments of the present disclosure, respectively, in which: FIG. 3 schematically shows a partial plan view of a first conductive layer of the display substrate, FIG. 4 schematically shows a partial plan view of a combination of the first conductive layer and a fourth conductive layer of the display substrate, FIG. 5 schematically shows a partial plan view of a semiconductor layer of the display substrate, FIG. 6 schematically shows a partial plan view of a combination of the first conductive layer, the fourth conductive layer and the semiconductor layer of the display substrate, FIG. 7 schematically shows a partial plan view of a third conductive layer of the display substrate, FIG. 8 schematically shows a partial plan view of a combination of the first conductive layer, the fourth conductive layer, the semiconductor layer and the third conductive layer of the display substrate, FIG. 9 schematically shows a partial plan view of a combination of the first conductive layer, the fourth conductive layer, the semiconductor layer, the third conductive layer and a first insulation layer of the display substrate, FIG. 10 schematically shows a partial plan view of a combination of the first conductive layer, the fourth conductive layer, the semiconductor layer, the third conductive layer, the first insulation layer and a second insulation layer of the display substrate, FIG. 11 schematically shows a partial plan view of a second conductive layer of the display substrate, and FIG. 12 schematically shows a partial plan view of a combination of the first conductive layer, the fourth conductive layer, the semiconductor layer, the third conductive layer, the first insulation layer, the second insulation layer and the second conductive layer of the display substrate. FIG. 14 is a cross-sectional view of the display substrate according to some exemplary embodiments of the present disclosure taken along line AA' in FIG. 13.

Referring to FIGS. 3 to 14 in combination, the display substrate may include a plurality of conductive layers, a semiconductor layer and a plurality of insulation layers. For ease of description, the plurality of conductive layers are described as a first conductive layer, a second conductive layer, a third conductive layer and a fourth conductive layer, respectively.

The display substrate may include: a base substrate 100, a first conductive layer 10 arranged on the base substrate 100, a third insulation layer IDL3 arranged on a side of the first conductive layer 10 away from the base substrate 100, a fourth conductive layer 40 arranged on a side of the third insulation layer IDL3 away from the base substrate 100, a buffer layer BFL arranged on a side of the fourth conductive layer 40 away from the base substrate 100, a semiconductor layer ACT arranged on a side of the buffer layer BFL away from the base substrate 100, a gate insulation layer GIL arranged on a side of the semiconductor layer ACT away from the base substrate 100, a third conductive layer 30 arranged on a side of the gate insulation layer GIL away from the base substrate 100, a first insulation layer IDL1 arranged on a side of the third conductive layer 30 away from the base substrate 100, a second insulation layer IDL2 arranged on a side of the first insulation layer IDL1 away from the base substrate 100, a second conductive layer 20 arranged on a side of the second insulation layer IDL2 away from the base substrate 100, a fourth insulation layer IDL4 arranged on a side of the second conductive layer 20 away from the base substrate 100, a first electrode layer 300 arranged on a side of the fourth insulation layer IDL4 away from the base substrate 100, a pixel definition layer PDL arranged on a side of the first electrode layer 300 away from the base substrate 100, a luminescent material layer EL arranged on a side of the pixel definition layer PDL away from the base substrate 100, and a second electrode layer 600 arranged on a side of the luminescent material layer EL away from the base substrate 100.

It should be noted that each of the above-mentioned insulation layers may include a single-layer structure or a stacked-layer structure including a plurality of insulation layers. For example, the fourth insulation layer IDL4 may include at least one passivation layer and at least one planarization layer. A specific structure of the insulation layer is not particularly limited in the embodiments of the present disclosure.

Referring to FIG. 3, FIG. 3 schematically shows a partial plan view of the first conductive layer 10. The first conductive layer 10 may contain a transparent conductive material, such as indium tin oxide (ITO). The second capacitance electrode Cst2 of the storage capacitance Cst may be located in the first conductive layer 10. In the embodiments of the present disclosure, the display substrate may further include a capacitance wire 5 for electrically connecting the storage capacitance Cst with the sensing transistor T3. Specifically, the capacitance wire 5 may be used to electrically connect the second capacitance electrode Cst2 of the storage capacitance Cst with one of the source electrode s3 and the drain electrode d3 of the sensing transistor T3. As shown in FIG. 3, the capacitance wire 5 may include a first connecting portion 51, a second connecting portion 53, and a capacitance wire body portion 52. The capacitance wire body portion 52 extends in the second direction Y, and the capacitance wire body portion 52 is located between the first connecting portion 51 and the second connecting portion 53. The first connecting portion 51 is connected to the second capacitance electrode Cst2, and the second connecting portion 53 is electrically connected to one of the source electrode s3 and the drain electrode d3 of the sensing transistor T3 (which will be described in detail below).

In some exemplary embodiments of the present disclosure, for one and the same sub-pixel, the second capacitance electrode Cst2 and the capacitance wire 5 are formed as a continuously extending integral structure. For example, as shown in FIG. 3, a partial plan view of the first conductive layers 10 of the four sub-pixels located in one and the same pixel unit is schematically shown. For each sub-pixel, the second capacitance electrode Cst2 has a block pattern with a large area, the capacitance wire 5 has a strip pattern with a large aspect ratio, and the block pattern and the strip pattern are connected with each other to form a continuously extending integral structure, which is beneficial to form the second capacitance electrode and the capacitance wire located in the same layer through a same patterning process.

It should be noted that herein, unless otherwise specified, the expression "continuously extending integral structure" means that at least two components located in the same layer extend continuously without disconnection. That is, at least two ends close to each other of the at least two components are connected with each other.

For example, in some exemplary embodiments of the present disclosure, for each sub-pixel, the first connecting portion 51 of the capacitance wire 5 extends in the first direction X, and the capacitance wire body portion 52 of the capacitance wire 5 extends in the second direction Y. An extension direction of the second connecting portion 53 of the capacitance wire 5 may be flexibly provided, for example, according to a position of one of the source electrode s3 and the drain electrode d3 of the sensing transistor T3 to be connected. The second connecting portion 53 may extend in the first direction X, or in the second direction Y, or in a direction inclined with respect to both the first direction X and the second direction Y.

For one and the same sub-pixel, an orthographic projection of the second capacitance electrode Cst2 of the pixel driving circuit of the sub-pixel on the base substrate 100 at least partially overlaps with an orthographic projection of the light emitting region of the sub-pixel on the base substrate 100.

Referring to FIG. 4, FIG. 4 schematically shows a partial plan view of the first conductive layer 10 and the fourth conductive layer 40. The fourth conductive layer 40 may contain a light shielding material, such as a metal material. In the embodiments of the present disclosure, the display substrate may further include a first conductive connecting portion 41, a second conductive connecting portion 42, a third conductive connecting portion 43 and a fourth conductive connecting portion 44 that are located in the fourth conductive layer 40. For one and the same sub-pixel, the first conductive connecting portion 41, the second conductive connecting portion 42, the third conductive connecting portion 43 and the fourth conductive connecting portion 44 are spaced apart from each other.

For one and the same sub-pixel, an orthographic projection of the first conductive connecting portion 41 on the base substrate 100 at least partially overlaps with an orthographic projection of the second capacitance electrode Cst2 on the base substrate 100, and an orthographic projection of the third conductive connecting portion 43 on the base substrate 100 at least partially overlaps with an orthographic projection of the capacitance wire 5 on the base substrate 100. For example, the orthographic projection of the third conductive connecting portion 43 on the base substrate 100 at least partially overlaps with an orthographic projection of the second connecting portion 53 of the capacitance wire 5 on the base substrate 100. Each of an orthographic projection of the second conductive connecting portion 42 on the base substrate 100 and an orthographic projection of the fourth conductive connecting portion 44 on the base substrate 100 does not overlap with the orthographic projection of the second capacitance electrode Cst2 on the base substrate 100 and the orthographic projection of the capacitance wire 5 on the base substrate 100.

Referring to FIG. 5, FIG. 5 schematically shows a partial plan view of the semiconductor layer ACT. Referring to FIG. 6, FIG. 6 schematically shows a partial plan view of the first conductive layer 10, the fourth conductive layer 40 and the semiconductor layer ACT. In the embodiments of the present disclosure, the semiconductor layer ACT may contain various types of semiconductor materials, such as an amorphous silicon semiconductor material, a polycrystalline silicon semiconductor material, or a metal oxide semiconductor material. With reference to FIG. 5 and FIG. 6 in combination, in the embodiments of the present disclosure, the display substrate may further include a first semiconductor portion 301, a second semiconductor portion 302 and a third semiconductor portion 303 that are located in the semiconductor layer ACT. The first capacitance electrode Cst1 of the storage capacitance Cst is located in the semiconductor layer ACT.

For example, the first semiconductor portion 301 corresponds to the driving transistor T1. The first semiconductor portion 301 may include a source region 301s, a drain region 301d, and a channel region 301c. The channel region 301c is a channel region of the driving transistor T1, and the source region 301s and the drain region 301d correspond to the source electrode s1 and the drain electrode d1 of the driving transistor T1, respectively. It should be understood that the channel region may have semiconductor characteristics, and the source region and the drain region may be semiconductor portions subjected to conductor processing, for example, semiconductor portions that are doped.

For example, the second semiconductor portion 302 corresponds to the switching transistor T2. The second semiconductor portion 302 may include a source region 302s, a drain region 302d, and a channel region 302c. The channel region 302c is a channel region of the switching transistor T2, and the source region 302s and the drain region 302d correspond to the source electrode s2 and the drain electrode d2 of the switching transistor T2, respectively.

For example, the third semiconductor portion 303 corresponds to the sensing transistor T3. The third semiconductor portion 303 may include a source region 303s, a drain region 303d, and a channel region 303c. The channel region 303c is a channel region of the sensing transistor T3, and the source region 303s and the drain region 303d correspond to the source electrode s3 and the drain electrode d3 of the sensing transistor T3, respectively.

In the embodiments of the present disclosure, the first capacitance electrode Cst1 of the storage capacitance Cst is located in the semiconductor layer ACT. It should be understood that, the first capacitance electrode Cst1 of the storage capacitance Cst may be a semiconductor portion subjected to conductor processing, for example, a semiconductor portion that is doped.

For one and the same sub-pixel, an orthographic projection of the first capacitance electrode Cst1 of the storage capacitance Cst on the base substrate 100 at least partially overlaps with the orthographic projection of the second capacitance electrode Cst2 of the storage capacitance Cst on the base substrate 100. In this way, the first capacitance electrode Cst1 and the second capacitance electrode Cst2 are arranged opposite to each other to form the storage capacitance Cst. That is, in the embodiments of the present disclosure, a capacitance electrode of the storage capacitance of the pixel driving circuit of the sub-pixel contains a transparent conductive material, and the other capacitance electrode contains a semiconductor material such as a metal oxide semiconductor.

In the embodiments of the present disclosure, the first capacitance electrode Cst1 of the storage capacitance Cst and the second semiconductor portion 302 are formed as a continuously extending integral structure, which is beneficial to form semiconductor patterns of the first capacitance electrode and the switching transistor of the pixel driving circuit of a same sub-pixel through a same patterning process.

For one and the same sub-pixel, the first semiconductor portion 301, the third semiconductor portion 303 and a combination of the first capacitance electrode Cst1 of the storage capacitance Cst and the second semiconductor portion 302 are spaced apart from each other.

For one and the same sub-pixel, the orthographic projection of the first capacitance electrode Cst1 of the pixel driving circuit of the sub-pixel on the base substrate 100 at least partially overlaps with the orthographic projection of the light emitting region of the sub-pixel on the base substrate 100. That is, at least a part of the first capacitance electrode Cst1 is located in the light emitting region.

In some exemplary embodiments of the present disclosure, for one and the same sub-pixel, an orthographic projection of the first semiconductor portion 301 on the base substrate 100 at least partially overlaps with the orthographic projection of the first conductive connecting portion 41 on the base substrate 100, and the orthographic projection of the first semiconductor portion 301 on the base substrate 100 at least partially overlaps with the orthographic projection of the second capacitance electrode Cst2 on the base substrate 100. For example, for one and the same sub-pixel, the orthographic projection of the first semiconductor portion 301 on the base substrate 100 falls within the orthographic projection of the first conductive connecting portion 41 on the base substrate 100, and the orthographic projection of the first semiconductor portion 301 on the base substrate 100 falls within the orthographic projection of the second capacitance electrode Cst2 on the base substrate 100.

In some exemplary embodiments of the present disclosure, for one and the same sub-pixel, an orthographic projection of the third semiconductor portion 303 on the base substrate 100 at least partially overlaps with the orthographic projection of the second conductive connecting portion 42 on the base substrate 100, and the orthographic projection of the third semiconductor portion 303 on the base substrate 100 at least partially overlaps with the orthographic projection of the third conductive connecting portion 43 on the base substrate 100. For example, for one and the same sub-pixel, an orthographic projection of one end of the third semiconductor portion 303 on the base substrate 100 at least partially overlaps with the orthographic projection of the second conductive connecting portion 42 on the base substrate 100, and an orthographic projection of the other end of the third semiconductor portion 303 on the base substrate 100 at least partially overlaps with the orthographic projection of the third conductive connecting portion 43 on the base substrate 100.

Referring to FIG. 7, FIG. 7 schematically shows a partial plan view of the third conductive layer 30. Referring to FIG. 8, FIG. 8 schematically shows a partial plan view of the first conductive layer 10, the fourth conductive layer 40, the semiconductor layer ACT and the third conductive layer 30. In the embodiments of the present disclosure, the third conductive layer 30 may contain various types of gate materials. Referring to FIG. 7 and FIG. 8 in combination, in the embodiments of the present disclosure, the display substrate may further include a first gate conductor portion 31, a second gate conductor portion 32, a first auxiliary wire 33, a second auxiliary wire 34 and a third auxiliary wire 35 that are located in the third conductive layer 30. The display substrate may further include a first scanning signal line GL1 and a second scanning signal line GL2 for supplying gate scanning signals. The first scanning signal line GL1 and the second scanning signal line GL2 are located in the third conductive layer 30.

For example, the first gate conductor portion 31 corresponds to the driving transistor T1, and an orthographic projection of the first gate conductor portion 31 on the base substrate 100 at least partially overlaps with the orthographic projection of the first semiconductor portion 301 (e.g., the channel region 301c of the driving transistor T1) on the base substrate 100. A part of the first gate conductor portion 31 that overlaps with the channel region 301c of the driving transistor T1 is formed as the gate electrode g1 of the driving transistor T1.

For example, the first scanning signal line GL1 corresponds to the switching transistor T2, and an orthographic projection of the first scanning signal line GL1 on the base substrate 100 at least partially overlaps with the orthographic projection of the second semiconductor portion 302 (e.g., the channel region 302c of the switching transistor T2) on the base substrate 100. A part of the first scanning signal line GL1 that overlaps with the channel region 302c of the switching transistor T2 is formed as the gate electrode g2 of the switching transistor T2. For example, the first scanning signal line GL1 includes a protrusion protruding in the second direction Y, which is the above-mentioned second gate conductor portion 32. In the embodiments of the present disclosure, the first scanning signal line GL1 is located below the channel region 302c of the switching transistor T2 in the second direction Y, and the second gate conductor portion 32 of the first scanning signal line GL1 extends toward the channel region 302c of the switching transistor T2 in an upward direction.

For example, the second scanning signal line GL2 corresponds to the sensing transistor T3, and an orthographic projection of the second scanning signal line GL2 on the base substrate 100 at least partially overlaps with the orthographic projection of the third semiconductor portion 303 (e.g., the channel region 303c of the sensing transistor T3) on the base substrate 100. A part of the second scanning signal line GL2 that overlaps with the channel region 303c of the sensing transistor T3 is formed as the gate electrode g3 of the sensing transistor T3.

In the embodiments of the present disclosure, the first scanning signal line GL1 and the second scanning signal line GL2 extend substantially in the first direction X. The first auxiliary wire 33, the second auxiliary wire 34 and the third auxiliary wire 35 extend substantially in the second direction Y.

In the embodiments of the present disclosure, the first scanning signal line GL1 and the second scanning signal line GL2 used to supply gate scanning signals to the pixel driving circuits of a same row of sub-pixels are respectively located on two sides of the light emitting regions of the same row of sub-pixels in the second direction Y. For example, in the illustrated embodiment, the first scanning signal line GL1 and the second scanning signal line GL2 used to supply gate scanning signals to the pixel driving circuits of the same row of sub-pixels are respectively located on an upper side and a lower side of the light emitting regions of the same row of sub-pixels in the second direction Y.

FIG. 9 schematically shows a partial plan view of a combination of the first conductive layer, the fourth conductive layer, the semiconductor layer, the third conductive layer and a first insulation layer of the display substrate. FIG. 10 schematically shows a partial plan view of a combination of the first conductive layer, the fourth conductive layer, the semiconductor layer, the third conductive layer, the first insulation layer and a second insulation layer of the display substrate. FIG. 9 and FIG. 10 schematically show some via holes located in the first insulation layer IDL1 and the second insulation layer IDL2, respectively.

Referring to FIG. 9 and FIG. 10, the display substrate may include a first via hole VH1 penetrating the first insulation layer IDL1 and a second via hole VH2 penetrating the second insulation layer IDL2. The first via hole VH1 exposes at least a part of the third conductive connecting portion 43. For example, the third conductive connecting portion 43 may include a first part 431 and a second part 432. The first via hole VH1 exposes the first part 431 of the third conductive connecting portion 43, and the second via hole VH2 exposes the first part 431 and the second part 432 of the third conductive connecting portion 43.

For example, an orthographic projection of the first via hole VH1 on the base substrate 100 at least partially overlaps with the orthographic projection of the second connecting portion 53 of the capacitance wire 5 on the base substrate 100. An orthographic projection of the second via hole VH2 on the base substrate 100 at least partially overlaps with the orthographic projection of the second connecting portion 53 of the capacitance wire 5 on the base substrate 100, and the orthographic projection of the second via hole VH2 on the base substrate 100 at least partially overlaps with the orthographic projection of the source region 303s or the drain region 303d of the sensing transistor T3 on the base substrate 100.

The display substrate may include a third via hole VH3 penetrating the first insulation layer IDL1 and a fourth via hole VH4 penetrating the second insulation layer IDL2. The third via hole VH3 exposes a part of the first conductive connecting portion 41, the fourth via hole VH4 exposes the first source region 301s or the first drain region 301d of the driving transistor T1, and the fourth via hole VH4 further exposes the third via hole VH3.

The display substrate may include a fifth via hole VH5 penetrating the second insulation layer IDL2. The fifth via hole VH5 exposes a part of the gate electrode g1 of the driving transistor T1 and a part of the first capacitance electrode Cst1.

Referring to FIG. 11, FIG. 11 schematically shows a partial plan view of the second conductive layer 20. Referring to FIG. 12, FIG. 12 schematically shows a partial plan view of the first conductive layer 10, the fourth conductive layer 40, the semiconductor layer ACT, the third conductive layer 30, the first insulation layer IDL1, the second insulation layer IDL2 and the second conductive layer 20. In the embodiments of the present disclosure, the second conductive layer 20 may contain various types of source and drain materials. With reference to FIG. 11 and FIG. 12 in combination, in the embodiments of the present disclosure, the display substrate may further include a first power signal line VDD, a data line DL, a sensing signal line SL, a first conductive portion 21, a second conductive portion 22, a third conductive portion 23, a fourth conductive portion 24 and a fifth conductive portion 25 that are located in the second conductive layer 20. For one and the same sub-pixel, the first power signal line VDD, the data line DL, the sensing signal line SL, the first conductive portion 21, the second conductive portion 22, the third conductive portion 23, the fourth conductive portion 24 and the fifth conductive portion 25 are spaced apart from each other.

An orthographic projection of the first conductive portion 21 on the base substrate 100 at least partially overlaps with an orthographic projection of the third via hole VH3 on the base substrate 100, and the orthographic projection of the first conductive portion 21 on the base substrate 100 at least partially overlaps with an orthographic projection of the fourth via hole VH4 on the base substrate 100. For example, the orthographic projection of the first conductive portion 21 on the base substrate 100 may cover the orthographic projection of the third via hole VH3 on the base substrate 100, and the orthographic projection of the first conductive portion 21 on the base substrate 100 may cover the orthographic projection of the fourth via hole VH4 on the base substrate 100. An electrical connection between the source electrode s1 or the drain electrode d1 of the driving transistor T1 and the second capacitance electrode Cst2 may be achieved, through a transfer conductive structure of the third via hole VH3, the fourth via hole VH4 and the first conductive portion 21.

An orthographic projection of the second conductive portion 22 on the base substrate 100 at least partially overlaps with an orthographic projection of the fifth via hole VH5 on the base substrate 100. For example, the orthographic projection of the second conductive portion 22 on the base substrate 100 may cover the orthographic projection of the fifth via hole VH5 on the base substrate 100. An electrical connection between the gate electrode g1 of the driving transistor T1 and the first capacitance electrode Cst1 may be achieved through a transfer conductive structure of the fifth via hole VH5 and the second conductive portion 22.

An orthographic projection of the third conductive portion 23 on the base substrate 100 at least partially overlaps with an orthographic projection of the first via hole VH1 on the base substrate 100, and the orthographic projection of the third conductive portion 23 on the base substrate 100 at least partially overlaps with an orthographic projection of the second via hole VH2 on the base substrate 100. For example, the orthographic projection of the third conductive portion 23 on the base substrate 100 may cover the orthographic projection of the first via hole VH1 on the base substrate 100, and the orthographic projection of the third conductive portion 23 on the base substrate 100 may cover the orthographic projection of the second via hole VH2 on the base substrate 100. An electrical connection between the source electrode s3 or the drain electrode d3 of the sensing transistor T3 and the capacitance wire 5 may be achieved through a transfer conductive structure of the first via hole VH1, the second via hole VH2 and the third conductive portion 23.

An orthographic projection of the fourth conductive portion 24 on the base substrate 100 at least partially overlaps with an orthographic projection of the sixth via hole VH6 on the base substrate 100. For example, the orthographic projection of the fourth conductive portion 24 on the base substrate 100 may cover the orthographic projection of the sixth via hole VH6 on the base substrate 100.

For example, the first power signal line VDD may be electrically connected to the source region s1 or the drain region d1 of the driving transistor T1 through a ninth via hole VH9.

For example, in the embodiments of the present disclosure, for one and the same sub-pixel, an orthographic projection of the data line DL on the base substrate 100 at least partially overlaps with an orthographic projection of the first auxiliary wire 33 on the base substrate 100. For example, the orthographic projection of the data line DL on the base substrate 100 covers the orthographic projection of the first auxiliary wire 33 on the base substrate 100. The data line DL may be electrically connected to the first auxiliary wire 33 through a tenth via hole VH10. For example, a plurality of tenth via holes VH10 may be arranged at intervals in the second direction Y, and the data line DL may be electrically connected to the first auxiliary wire 33 through the plurality of tenth via holes VH10 arranged at intervals. In this way, a contact area between the data line DL and the first auxiliary wire 33 may be increased, thereby a contact resistance is reduced, and a voltage drop on the data line DL is reduced.

In the embodiments of the present disclosure, for one and the same sub-pixel, the first auxiliary wire 33 electrically connected to the data line used to supply a data signal to the pixel driving circuit of the sub-pixel has an orthographic projection on the base substrate 100 that at least partially overlaps with the orthographic projection of the capacitance wire body portion 52 of the pixel driving circuit of the sub-pixel on the base substrate 100.

For example, in the embodiments of the present disclosure, for one and the same sub-pixel, an orthographic projection of the sensing signal line SL on the base substrate 100 at least partially overlaps with an orthographic projection of the second auxiliary wire 34 on the base substrate 100. For example, the orthographic projection of the sensing signal line SL on the base substrate 100 covers the orthographic projection of the second auxiliary wire 34 on the base substrate 100. The sensing signal line SL may be electrically connected to the second auxiliary wire 34 through an eleventh via hole VH11. For example, a plurality of eleventh via holes VH11 may be arranged at intervals in the second direction Y, and the sensing signal line SL may be electrically connected to the first auxiliary wire 33 through the plurality of eleventh via holes VH11 arranged at intervals. In this way, a contact area between the sensing signal line SL and the second auxiliary wire 34 may be increased, thereby a contact resistance is reduced, and a voltage drop on the signal line SL is reduced For example, in the embodiments of the present disclosure, for one and the same sub-pixel, an orthographic projection of the first power signal line VDD on the base substrate 100 at least partially overlaps with an orthographic projection of the third auxiliary wire 35 on the base substrate 100. For example, the orthographic projection of the first power signal line VDD on the base substrate 100 covers the orthographic projection of the third auxiliary wire 35 on the base substrate 100. The first power signal line VDD may be electrically connected to the third auxiliary wire 35 through a twelfth via hole VH12. For example, a plurality of twelfth via holes VH12 may be arranged at intervals in the second direction Y, and the first power signal line VDD may be electrically connected to the third auxiliary wire 35 through the plurality of twelfth via holes VH12 arranged at intervals. In this way, a contact area between the first power signal line VDD and the third auxiliary wire 35 may be increased, thereby a contact resistance is reduced, and a voltage drop on the first power signal line VDD is reduced.

For example, the data line DL may be electrically connected to the source region s2 or the drain region d2 of the switching transistor T2 through a thirteenth via hole VH13.

In the embodiments of the present disclosure, two data lines DL are provided between two adjacent sub-pixels located in a same row. For example, two adjacent sub-pixels in the same row include a first sub-pixel SP1 and a second sub-pixel SP2, and the two data lines include a first data line DL1 and a second data line DL2.

The first data line DL1 is used to supply a data signal to the first sub-pixel SP1, and the data line body portion of the data line DL1 used to supply the data signal to the pixel driving circuit of the first sub-pixel has an orthographic projection on the base substrate that completely covers an orthographic projection of the capacitance wire body portion 52 of the pixel driving circuit of the first sub-pixel on the base substrate.

The second data line DL2 is used to supply a data signal to the second sub-pixel SP2, and the data line body portion of the data line DL2 used to supply the data signal to the pixel driving circuit of the second sub-pixel has an orthographic projection on the base substrate that completely covers an orthographic projection of the capacitance wire body portion 52 of the pixel driving circuit of the second sub-pixel on the base substrate.

The first connecting portion 51 of the capacitance wire 5 of the pixel driving circuit of the first sub-pixel extends toward the first data line DL1 in the first direction X, and the first connecting portion 51 of the capacitance wire 5 of the pixel driving circuit of the second sub-pixel extends toward the second data line DL2 in the first direction X.

For example, the sensing signal line SL may include a first part SL1 extending in the second direction Y and a second part SL2 extending in the first direction X. In the first direction X, the second sub-pixel SP2 is adjacent to the sensing signal line SL, and the first sub-pixel SP1 is located on a side of the second sub-pixel SP2 away from the sensing signal line SL.

For example, one end of the second conductive connecting portion 42 is electrically connected to the other of the source electrode s3 and the drain electrode d3 of the sensing transistor T3 of the pixel driving circuit of the first sub-pixel SP1 through the sixth via hole VH6, and the other end of the second conductive connecting portion 42 is electrically connected to the other of the source electrode s3 and the drain electrode d3 of the sensing transistor T3 of the pixel driving circuit of the second sub-pixel SP2 through a seventh via hole VH7.

The second part SL2 of the sensing signal line is electrically connected to the other end of the second conductive connecting portion 42 and the other of the source electrode s3 and the drain electrode d3 of the sensing transistor T3 of the pixel driving circuit of the second sub-pixel SP2 through an eighth via hole VH8. In this way, a sensing signal supplied by the sensing signal line SL may be transmitted to each sub-pixel of a pixel unit.

For example, the first power signal line VDD is located on a side of the first sub-pixel SP1 away from the second sub-pixel SP2. The first power signal line VDD may be electrically connected to the source electrode s1 or the drain electrode d1 of the driving transistor T1 through a fourteenth via hole VH14, the fourth conductive connecting portion 44, a fifteenth via hole VH15 and the fifth conductive portion 25.

In the embodiments of the present disclosure, referring to FIG. 13, the pixel definition layer PDL includes a plurality of openings 80 for defining the light emitting regions SPA1, SPA2, SPA3 and SPA4 of the plurality of sub-pixels. The capacitance wire 5 is used to electrically connect one of the source electrode s3 and the drain electrode d3 of the sensing transistor T3 with the second capacitance electrode Cst2. The capacitance wire 5 includes the capacitance wire body portion 52 extending in the second direction Y. For one and the same sub-pixel, the orthographic projection of the capacitance wire body portion 52 of the pixel driving circuit of the sub-pixel on the base substrate 100 is spaced apart from an orthographic projection of the light emitting region SPA1, SPA2, SPA3 or SPA4 of the sub-pixel on the base substrate 100. That is, the capacitance wire body portion 52 of the pixel driving circuit of the sub-pixel does not fall within the light emitting region of the sub-pixel.

The inventors found through researches that the capacitance wire 5 formed by the transparent conductive material is not completely transparent, that is, it still has a shielding effect on light. In the embodiments of the present disclosure, by providing most of the capacitance wire (e.g., the capacitance wire body portion 52) outside the light emitting region of the sub-pixel, the shielding effect of the capacitance wire on the light emitted from the light emitting region may be reduced, thereby the light transmittance of the light emitting region may be improved. In this way, a display quality of the display substrate may be improved without affecting a driving of the sensing transistor.

In the embodiments of the present disclosure, the data line DL includes a data line body portion DLS extending in the second direction Y. For one and the same sub-pixel, the data line body portion DLS of the data line used to supply a data signal to the pixel driving circuit of the sub-pixel has an orthographic projection on the base substrate 100 that at least partially overlaps with the orthographic projection of the capacitance wire body portion 52 of the pixel driving circuit of the sub-pixel on the base substrate 100. For example, for one and the same sub-pixel, the data line body portion DLS of the data line used to supply a data signal to the pixel driving circuit of the sub-pixel has an orthographic projection on the base substrate 100 that completely covers the orthographic projection of the capacitance wire body portion 52 of the pixel driving circuit of the sub-pixel on the base substrate 100. In the OLED display substrate, the data line DL is provided outside the light emitting region. In the embodiments of the present disclosure, most of the capacitance wire (e.g., the capacitance wire body portion 52) is provided below the data line DL to achieve the purpose of providing the most of the capacitance wire outside the light emitting region. In addition, by providing most of the capacitance wire (e.g., the capacitance wire body portion 52) below the data line DL, the capacitance wire outside the light emitting region may not occupy additional layout space of the display substrate, which is beneficial to implement a high PPI display substrate.

The embodiments of the present disclosure further provide a display device that may include the above-mentioned display substrate. The display device may include but may not be limited to any product or component with a display function, such as electronic papers, mobile phones, tablet computers, televisions, displays, notebook computers, digital photo frames, navigators, etc. It should be understood that the display device has the same beneficial effects as the display substrate provided in the foregoing embodiments.

Although some embodiments according to the general concept of the present disclosure have been illustrated and described, it should be understood by those ordinary skilled in the art that changes may be made to these embodiments without departing from the principle and spirit of the general inventive concept of the present disclosure. The scope of the present disclosure is defined by the claims and their equivalents.

What is claimed is:

1. A display substrate, comprising:
   a base substrate;
   a plurality of pixel units arranged on the base substrate, wherein the plurality of pixel units are arranged in an array in a first direction and a second direction, at least one pixel unit comprises a plurality of sub-pixels, and at least one sub-pixel comprises a light emitting element and a pixel driving circuit for driving the light emitting element;
   a semiconductor layer arranged on the base substrate;
   a first conductive layer arranged on a side of the semiconductor layer close to the base substrate;
   a second conductive layer arranged on a side of the semiconductor layer away from the base substrate; and
   a pixel definition layer arranged on a side of the second conductive layer away from the base substrate, wherein the pixel definition layer comprises a plurality of openings for defining light emitting regions of the plurality of sub-pixels,
   wherein the pixel driving circuit comprises a sensing transistor, a storage capacitance and a capacitance wire, the sensing transistor comprises a source electrode and a drain electrode, the storage capacitance comprises a first capacitance electrode and a second capacitance electrode arranged opposite to each other, and the capacitance wire is configured to electrically connect one of the source electrode and the drain electrode of the sensing transistor with the second capacitance electrode;
   wherein the source electrode and the drain electrode of the sensing transistor are located in the second conductive layer, the second capacitance electrode and the capacitance wire are located in the first conductive layer, and the capacitance wire comprises a capacitance wire body portion extending in the second direction; and wherein for one and the same sub-pixel, an orthographic projection of the capacitance wire body portion of the pixel driving circuit of the sub-pixel on the base substrate is spaced apart from an orthographic projection of the light emitting region of the sub-pixel on the base substrate;

wherein the display substrate further comprises a data line for supplying a data signal, the data line is located in the second conductive layer, and the data line comprises a data line body portion extending in the second direction; and wherein for one and the same sub-pixel, the data line body portion of the data line configured to supply the data signal to the pixel driving circuit of the sub-pixel has an orthographic projection on the base substrate that at least partially overlaps with an orthographic projection of the capacitance wire body portion of the pixel driving circuit of the sub-pixel on the base substrate.

2. The display substrate according to claim 1, wherein for one and the same sub-pixel, the data line body portion of the data line configured to supply the data signal to the pixel driving circuit of the sub-pixel has an orthographic projection on the base substrate that completely covers the orthographic projection of the capacitance wire body portion of the pixel driving circuit of the sub-pixel on the base substrate.

3. The display substrate according to claim 1, wherein for one and the same sub-pixel, an orthographic projection of the second capacitance electrode of the pixel driving circuit of the sub-pixel on the base substrate at least partially overlaps with the orthographic projection of the light emitting region of the sub-pixel on the base substrate; and wherein the capacitance wire comprises a first connecting portion and a second connecting portion, the capacitance wire body portion is located between the first connecting portion and the second connecting portion, the first connecting portion is connected to the second capacitance electrode, and the second connecting portion is electrically connected to one of the source electrode and the drain electrode of the sensing transistor.

4. The display substrate according to claim 3, wherein the display substrate further comprises a third conductive layer located between the semiconductor layer and the second conductive layer;

wherein the display substrate further comprises a first auxiliary wire located in the third conductive layer, the first auxiliary wire extends in the second direction, and the first auxiliary wire is electrically connected to the data line; and wherein for one and the same sub-pixel, the first auxiliary wire electrically connected to the data line configured to supply a data signal to the pixel driving circuit of the sub-pixel has an orthographic projection on the base substrate that at least partially overlaps with the orthographic projection of the capacitance wire body portion of the pixel driving circuit of the sub-pixel on the base substrate.

5. The display substrate according to claim 3, wherein the first capacitance electrode is located in the semiconductor layer; and wherein for one and the same sub-pixel, an orthographic projection of the first capacitance electrode of the pixel driving circuit of the sub-pixel on the base substrate at least partially overlaps with the orthographic projection of the light emitting region of the sub-pixel on the base substrate.

6. The display substrate according to claim 4, wherein the display substrate further comprises a first scanning signal line and a second scanning signal line for supplying gate scanning signals, and the first scanning signal line and the second scanning signal line are located in the third conductive layer;

wherein the pixel driving circuit further comprises a switching transistor, a part of the first scanning signal line overlapping with the semiconductor layer is a gate electrode of the switching transistor, and a part of the second scanning signal line overlapping with the semiconductor layer is a gate electrode of the sensing transistor; and wherein the first scanning signal line and the second scanning signal line configured to supply gate scanning signals to the pixel driving circuits of one and the same row of sub-pixels are respectively located on two sides of the light emitting regions of the same row of sub-pixels in the second direction.

7. The display substrate according to claim 6, wherein the display substrate further comprises a fourth conductive layer between the first conductive layer and the semiconductor layer;

wherein the display substrate further comprises a third conductive connecting portion located in the fourth conductive layer and a third semiconductor portion located in the semiconductor layer, the third semiconductor portion comprises a third source region, a third drain region and a channel region of the sensing transistor, and the third source region and the third drain region are respectively located on two sides of the channel region of the sensing transistor; and wherein the third conductive connecting portion comprises a first part and a second part, an orthographic projection of the first part of the third conductive connecting portion on the base substrate overlaps with an orthographic projection of the second connecting portion of the capacitance wire on the base substrate, and an orthographic projection of one of the third source region and the third drain region on the base substrate overlaps with an orthographic projection of the second part of the third conductive connecting portion on the base substrate.

8. The display substrate according to claim 7, wherein the display substrate further comprises a first insulation layer and a second insulation layer, and the first insulation layer and the second insulation layer are located between the third conductive layer and the second conductive layer;

wherein the display substrate comprises a first via hole penetrating the first insulation layer and a second via hole penetrating the second insulation layer;

wherein the first via hole exposes the first part of the third conductive connecting portion, and the second via hole exposes the first part and the second part of the third conductive connecting portion; and wherein an orthographic projection of one of the source electrode and the drain electrode of the sensing transistor on the base substrate covers each of an orthographic projection of the first via hole on the base substrate and an orthographic projection of the second via hole on the base substrate.

9. The display substrate according to claim 8, wherein the display substrate further comprises a first conductive connecting portion located in the fourth conductive layer, and an orthographic projection of the first conductive connecting portion on the base substrate at least partially overlaps with the orthographic projection of the first capacitance electrode on the base substrate.

10. The display substrate according to claim 9, wherein the pixel driving circuit further comprises a driving transistor, and the driving transistor comprises a channel region, a gate electrode, a source electrode and a drain electrode;

wherein the display substrate further comprises a first semiconductor portion located in the semiconductor layer, the first semiconductor portion comprises a first source region, a first drain region and a channel region of the driving transistor, and the first source region and the first drain region are respectively located on two sides of the channel region of the driving transistor;

wherein the display substrate comprises a third via hole penetrating the first insulation layer and a fourth via hole penetrating the second insulation layer;

wherein the third via hole exposes a part of the first conductive connecting portion, and the fourth via hole exposes the third via hole and a part of one of the first source region and the first drain region; and wherein an orthographic projection of one of the source electrode and the drain electrode of the driving transistor on the base substrate covers each of an orthographic projection of the third via hole on the base substrate and an orthographic projection of the fourth via hole on the base substrate.

11. The display substrate according to claim 10, wherein the switching transistor comprises a channel region, the display substrate further comprises a second semiconductor portion located in the semiconductor layer, the second semiconductor portion comprises a second source region, a second drain region and a channel region of the switching transistor, and the second source region and the second drain region are respectively located on two sides of the channel region of the switching transistor; and wherein the second capacitance electrode and the second semiconductor portion are formed as a continuously extending integral structure.

12. The display substrate according to claim 11, wherein the display substrate comprises a fifth via hole penetrating the second insulation layer; and wherein the fifth via hole exposes a part of the gate electrode of the driving transistor and a part of the first capacitance electrode, and the gate electrode of the driving transistor, the first capacitance electrode and one of the source electrode and the drain electrode of the switching transistor are electrically connected through the fifth via hole.

13. The display substrate according to claim 1, wherein two data lines are arranged between two adjacent sub-pixels located in a same row, the two adjacent sub-pixels located in the same row comprise a first sub-pixel and a second sub-pixel, and the two data lines comprise a first data line and a second data line;

wherein the first data line is configured to supply a data signal to the first sub-pixel, and the data line body portion of the data line configured to supply the data signal to the pixel driving circuit of the first sub-pixel has an orthographic projection on the base substrate that completely covers an orthographic projection of the capacitance wire body portion of the pixel driving circuit of the first sub-pixel on the base substrate; and wherein the second data line is configured to supply a data signal to the second sub-pixel, and the data line body portion of the data line configured to supply the data signal to the pixel driving circuit of the second sub-pixel has an orthographic projection on the base substrate that completely covers an orthographic projection of the capacitance wire body portion of the pixel driving circuit of the second sub-pixel on the base substrate.

14. The display substrate according to claim 13, wherein the first connecting portion of the capacitance wire of the pixel driving circuit of the first sub-pixel extends toward the first data line in the first direction, and the first connecting portion of the capacitance wire of the pixel driving circuit of the second sub-pixel extends toward the second data line in the first direction.

15. The display substrate according to claim 14, wherein the display substrate further comprises a sensing signal line located in the second conductive layer, and the sensing signal line comprises a first part extending in the second direction and a second part extending in the first direction; and wherein the second sub-pixel is adjacent to the sensing signal line in the first direction, and the first sub-pixel is located on a side of the second sub-pixel away from the sensing signal line.

16. The display substrate according to claim 15, wherein the display substrate further comprises a second conductive connecting portion located in the fourth conductive layer;

wherein one end of the second conductive connecting portion is electrically connected to the other of the source electrode and the drain electrode of the sensing transistor of the pixel driving circuit of the first sub-pixel through a sixth via hole, and the other end of the second conductive connecting portion is electrically connected to the other of the source electrode and the drain electrode of the sensing transistor of the pixel driving circuit of the second sub-pixel through a seventh via hole; and wherein the second part of the sensing signal line is electrically connected to the other end of the second conductive connecting portion and the other of the source electrode and the drain electrode of the sensing transistor of the pixel driving circuit of the second sub-pixel through an eighth via hole.

17. The display substrate according to claim 16, wherein the display substrate further comprises a second auxiliary wire located in the third conductive layer, the second auxiliary wire extends in the second direction, the second auxiliary wire is electrically connected to the sensing signal line, and an orthographic projection of the second auxiliary wire on the base substrate at least partially overlaps with an orthographic projection of the sensing signal line on the base substrate.

18. The display substrate according to claim 7, wherein the first conductive layer comprises a transparent conductive material; and/or wherein the fourth conductive layer comprises a light shielding material.

19. A display device, comprising the display substrate according to claim 1.

* * * * *